(12) United States Patent
Nishimura et al.

(10) Patent No.: US 6,462,802 B1
(45) Date of Patent: Oct. 8, 2002

(54) LIQUID CRYSTAL DISPLAY DEVICE HAVING WIRING LAYER MADE OF NITRIDE OF NB OR NITRIDE ALLOY CONTAINING NB AS A MAIN COMPONENT

(75) Inventors: Etsuko Nishimura, Hitachiota; Genshiro Kawachi, Hitachi; Kenichi Onisawa, Hitachinaka; Kenichi Chahara, Hitachi; Takeshi Sato, Hitachi; Katsumi Tamura, Hitachi, all of (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 09/234,120

(22) Filed: Jan. 19, 1999

(30) Foreign Application Priority Data

Jan. 19, 1998 (JP) .............................. 10-007243

(51) Int. Cl.⁷ ...................... G02F 1/1343; H01L 23/48
(52) U.S. Cl. ...................... 349/147; 257/761; 349/43
(58) Field of Search .............................. 349/42, 43, 46, 349/147, 143, 139; 257/761

(56) References Cited

U.S. PATENT DOCUMENTS

| | | | |
|---|---|---|---|
| 5,264,728 A | | 11/1993 | Ikeda et al. |
| 5,334,544 A | * | 8/1994 | Matsuoka et al. ............ 437/40 |
| 5,500,301 A | | 3/1996 | Onishi et al. |
| 5,594,259 A | * | 1/1997 | Shimada et al. .............. 257/66 |
| 5,646,449 A | | 7/1997 | Nakamura et al. |
| 5,739,877 A | * | 4/1998 | Onisawa et al. .............. 349/42 |
| 5,831,694 A | * | 11/1998 | Onisawa et al. .............. 349/43 |
| 5,995,177 A | * | 11/1999 | Fujikawa et al. ............. 349/46 |
| 6,043,859 A | * | 3/2000 | Maeda ........................ 349/143 |

FOREIGN PATENT DOCUMENTS

| | | |
|---|---|---|
| EP | 0 430 702 B1 | 6/1991 |
| EP | 0 716 334 A2 | 6/1996 |
| JP | A-1-321540 | 12/1989 |
| JP | A-2-106723 | 4/1990 |
| JP | A-2-232627 | 9/1990 |
| JP | A-2-257123 | 10/1990 |
| JP | A-3-182723 | 8/1991 |
| JP | A-5-55575 | 3/1993 |
| JP | A-6-160877 | 6/1994 |
| JP | 06-194677 * | 7/1994 |
| JP | A-6-214255 | 8/1994 |
| JP | 06-265933 * | 9/1994 |
| JP | A-7-147852 | 6/1995 |
| JP | A-9-5782 | 1/1997 |

* cited by examiner

Primary Examiner—Kenneth Parker
(74) Attorney, Agent, or Firm—Antonelli, Terry, Stout & Kraus, LLP

(57) ABSTRACT

A wiring of a liquid crystal display device is made of a lamination film including a first layer of Nb or alloy containing Nb as its main component and a second layer of nitride of Nb or alloy containing Nb as its main component. A liquid crystal display device having such a wiring provides a wiring structure excellent in resistance to thermal oxidation.

17 Claims, 19 Drawing Sheets

LIQUID CRYSTAL DISPLAY DEVICE HAVING WIRING LAYER MADE OF NITRIDE OF NB OR NITRIDE ALLOY CONTAINING NB AS A MAIN COMPONENT

BACKGROUND OF THE INVENTION

1. Field of the Invention

The present invention relates to a liquid crystal display device, and more particularly to an electrode wiring structure of a liquid crystal display device.

2. Description of the Related Art

The official Gazette of JP-A-3-182723 describes a gate wiring of a liquid crystal display made of a lamination of a polysilicon film having a high impurity concentration and an aluminum (Al) film.

The official Gazette of JP-A-5-55575 describes a wiring of a liquid crystal display made of a metal material having a low resistance and anti-chemicals performance: alloy of tantalum (Ta) and niobium (Nb); Nb; or metal containing Nb as its main component.

The official Gazette of JP-A-2-106723 proposes a thin film transistor TFT having a gate wiring made of a lamination of Nb and Ta stacked in this order from the substrate side, the surface of the lamination being oxidized, and a gate insulating film made of silicon oxide ($SiO_2$) or silicon nitride (SiN) stacked upon the gate electrode lamination. This Gazette describes that as compared to a Ta single layer, the resistance can be lowered and it is effective for preventing a short circuit between a gate line and a drain line.

The Gazette of JP-7-147852 proposes to use Nb for all or at least ones of gate and drain electrodes. This Gazette describes that an electrode structure having an improved throughput, a low resistance, and a low stress, and being easy to dry-etch can be realized because a two-layer structure made of such as alloy and different metal materials is not incorporated.

The Gazette of JP-A-2-232627 describes an auxiliary wiring formed on a scan line, the auxiliary wiring being made of Ti, Zr, Hf, V, Nb or the like, or nitride thereof and having a low resistance and a low contact resistance relative to the scan line.

A wiring of a conventional liquid crystal display device, particularly a gate electrode made of Al, is associated with the following problems. Hillocks or whiskers are formed during a heat treatment for an interlayer insulating film because of a low melting point (660.4° C.) of Al, a rounded drive waveform is formed by a wiring resistance rise because of poor resistance to thermal oxidation of Al, or a short circuit between wirings is formed.

An Al film is patterned generally through wet etching to form a wiring pattern. Therefore, it is difficult to control the shape of a peripheral wall of the etched wiring, which may easily cause a defective portion around an interlayer insulating film and a drain electrode wiring, resulting in a short circuit between wirings and a breakage of a drain line.

SUMMARY OF THE INVENTION

It is an object of the present invention to provide a liquid crystal display device having a wiring structure excellent in resistance to thermal oxidation.

According to one aspect of the present invention, a metal wiring of a liquid crystal display device has a lamination structure of a first layer made of Nb or alloy containing Nb as a main component thereof and a second layer made of nitride of Nb or alloy containing Nb as a main component. With this lamination structure, resistance to thermal oxidation of the metal wiring can be improved. If the resistance of the metal wiring poses not practical problem, the metal wiring may be a single layer made of nitride of Nb or alloy containing Nb as a main component, by omitting the first layer made of Nb or alloy containing Nb as its main component. With this single layer structure, the resistance to thermal oxidation can also be improved.

If a third layer made of nitride of Nb or alloy containing Nb as a main component is formed under the first layer, it is possible to prevent a direct contact of the first layer with another layer different from the third layer. Nitride of Nb or alloy containing Nb as its main component properly matches another layer, particularly an insulating film. It is therefore possible to prevent a resistance increase and a breakage of the first layer or the like. Even if a silicon oxide film is formed on the metal wiring layer, the metal wiring layer is not oxidized and the wiring layer of better quality can be realized.

If the first and second layers, or preferably also the third layer are etched in succession into the same pattern, the number of process steps can be reduced. The peripheral wall of the etched metal wiring can be formed to have a normal taper shape.

According to another aspect of the invention, in a liquid crystal display device having a pair of substrates with a liquid crystal layer being interposed therebetween, a plurality of gate electrode wirings, a plurality of drain electrode wirings crossing the plurality of gate electrode wirings, a plurality of thin film transistors formed at cross points between the plurality of gate and drain electrode wirings, and a plurality of source electrodes formed in correspondence with the plurality of thin film transistors, respectively being formed on one of the pair of substrates, at least ones of the plurality of gate electrode wirings, drain electrode wirings, source electrodes, common electrodes if provided, and common electrode wirings if provided are each made of a lamination film including a first layer made of Nb or alloy containing Nb as a main component thereof and a second layer made of nitride of Nb or alloy containing Nb as a main component. With this lamination film, the resistance to thermal oxidation can also be improved. If the lamination film is used as the gate electrode wiring, the improvement is particularly good. If the resistance of the metal wiring poses not practical problem, the metal wiring may be only the second layer made of nitride of Nb or alloy containing Nb as a main component, by omitting the first layer made of Nb or alloy containing Nb as its main component. With this single layer structure, the resistance to thermal oxidation can also be improved.

It is preferable to form a third layer made of nitride of Nb or alloy containing Nb as a main component, under the first layer.

If an insulating film of silicon oxide is formed on the lamination metal wiring made of the first and second layers is formed, the wiring layer of better quality can be realized.

If the electrode structure of the invention is applied to the gate electrode wiring, it is preferable to uses the silicon oxide film as at least a portion of the gate insulating film of a thin film transistor.

DETAILED DESCRIPTION OF THE PREFERRED EMBODIMENTS

Figure 1:
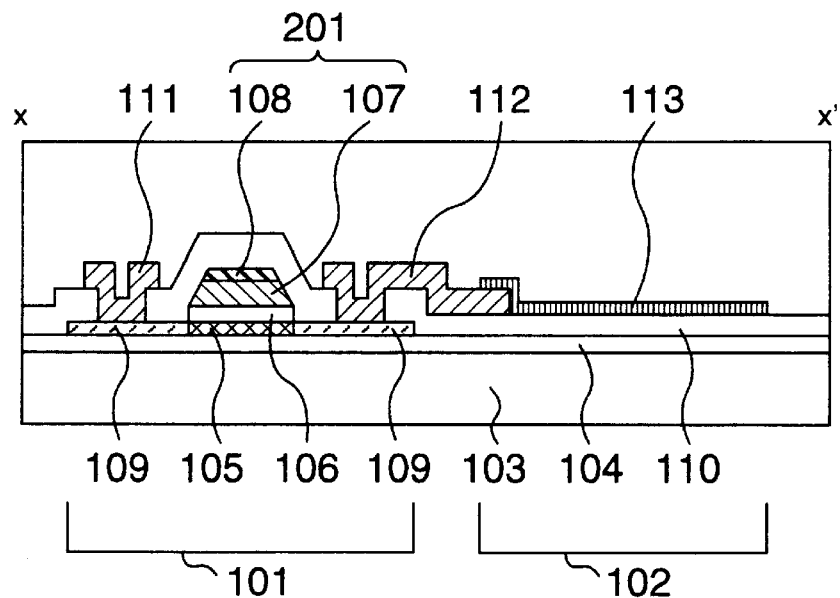
FIG. 1 is a cross sectional view of a liquid crystal display device having coplanar type TFT's, taken along line x–x' shown in FIG. 2, according to an embodiment of the invention.

First, main reference numerals and symbols used in this specification will be described. Reference numeral 50 represents an active matrix, 51 a vertical scan circuit, 52 a switch matrix circuit, 53 a horizontal scan circuit, 101 a TFT, 102 a pixel display area, 103 a glass substrate, 104 an underlying layer, 105 a TFT channel region, 106 a gate insulating film, 107 a first layer made of Nb or alloy containing Nb as its main component, 108 a second layer made of nitride of Nb or alloy containing Nb as its main component, 109 drain/source active regions doped with impurities, 110 and 1501 an interlayer insulating film, 111 a drain electrode, 112 a source electrode, 113 a pixel electrode, 114 a protective insulating film, 201 a gate electrode, 202 a gate electrode wiring, 203 a drain electrode wiring, 401 an island pattern made of an intrinsic polysilicon film, 701 a p-channel MOS, 702 an n-channel MOS, 703 and 704 a TFT gate electrode, 705 a first electrode wiring, 706 a second electrode wiring, 1001 an added capacitor, 1101 a first gate insulating film made of an $SiO_2$ film, 1102 a second gate insulating film made of an SiN, 1302 a liquid crystal layer, 1304 a color filter, 1305 an opposing glass substrate, 1306 an opposing electrode, 1307 a color filter protective film, 1308 a light shielding film, 1401 a first gate electrode made of a polysilicon film doped with impurities, 1801 an amorphous silicon film, TH a through hole, SL a sealing material, SIL a silver paste material, OR11 and OR12 an orientation film, and BL a back light.

Figure 14:
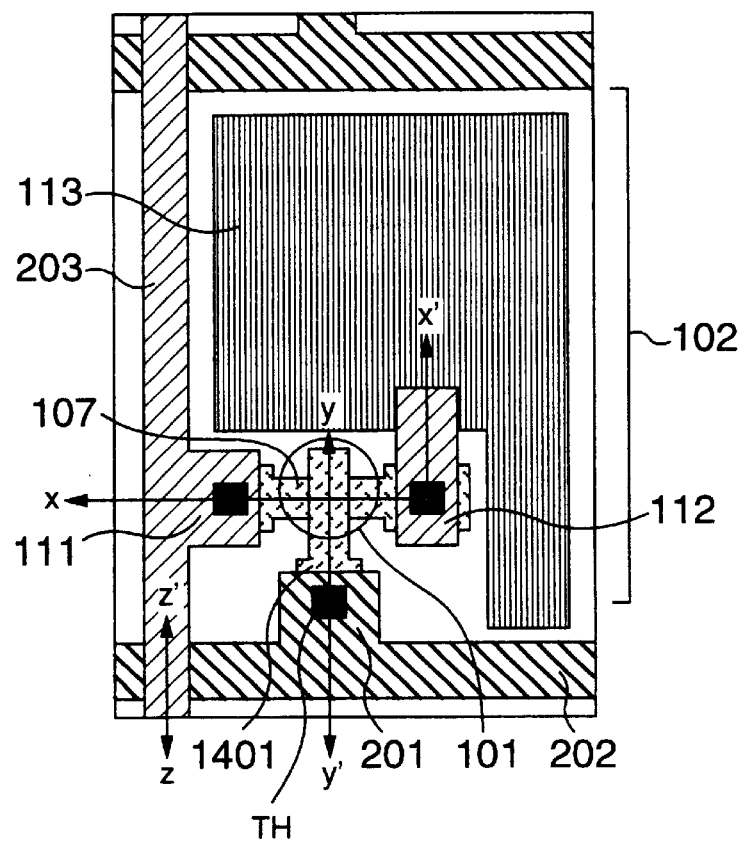
FIG. 14 is a plan view of a single pixel of an active matrix type liquid crystal display device using coplanar type TFT's according to a comparative example of the invention.
Figure 15:
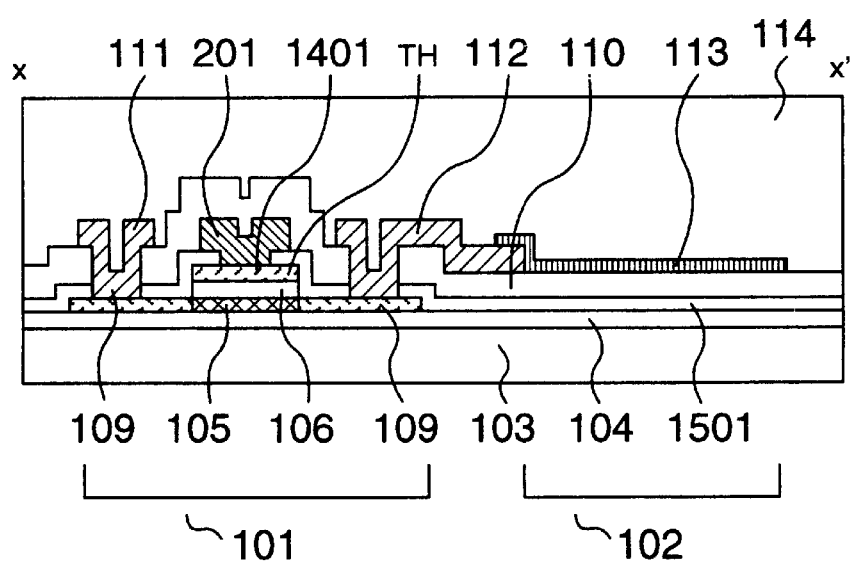
FIG. 15 is a cross sectional view taken along line x–x' shown in FIG. 14.
Figure 16:
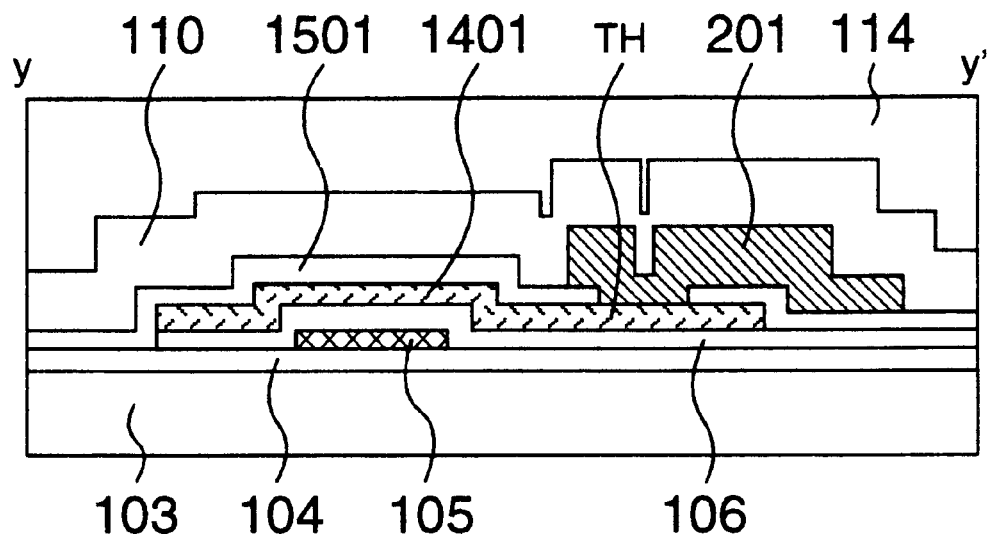
FIG. 16 is a cross sectional view taken along line y–y' shown in FIG. 14.
Figure 17:
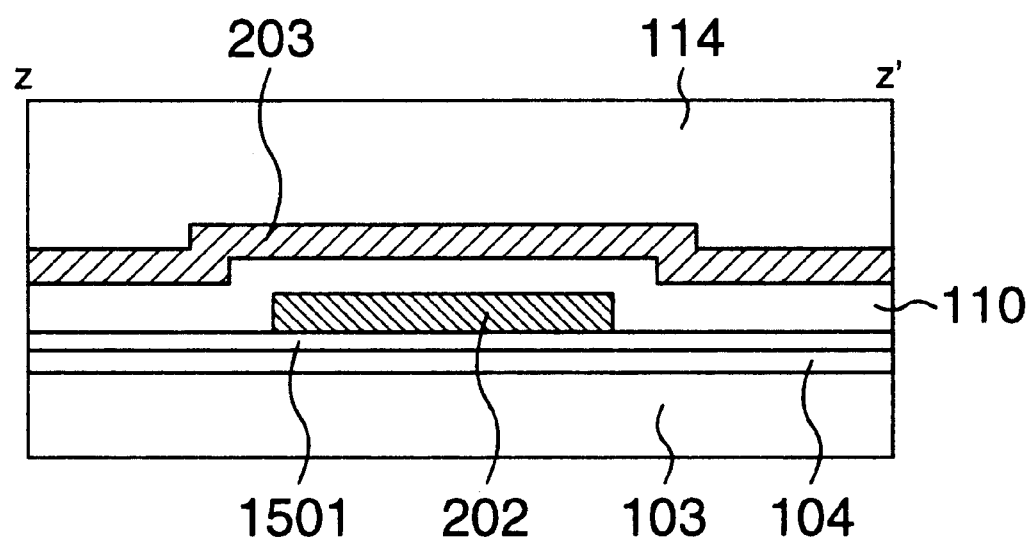
FIG. 17 is a cross sectional view taken along line z–z' shown in FIG. 14.

FIG. 14 is a plan view of a single pixel of a liquid crystal display device using coplanar type TFT's according to a comparative example. FIGS. 15 to 17 are cross sectional views respective taken along lines x–x', y–y', and z–z' shown in FIG. 14.

The liquid crystal display device is constituted of the gate electrode wiring 202 formed on the underlying film 104 on the glass substrate 103, the drain electrode wiring 203 crossing the gate electrode wiring 202, TFT 101 formed near each cross point between the gate and drain electrode wirings, and the pixel display area 102.

As shown in FIG. 15, TFT 101 is constituted of the channel region 105 made of an intrinsic polysilicon film, the gate insulating film 106 formed on the channel region 105, the first gate electrode 1401 formed on the gate insulating film 106 and made of a polysilicon film doped with impurities, the second gate electrode 201 made of aluminum (Al), drain/source active regions 109 in the channel region 105 made of the intrinsic polysilicon film and doped with impurities, and the drain and source electrodes 111 and 112 connected via through holes to the drain and source active regions. The source electrode 112 of TFT is connected to the pixel electrode 113. Reference numerals 1501 and 110 represent an interlayer insulating film, and reference numeral 114 represents a protective insulating film.

Paying attention to the gate electrode of TFT 101, it can be understood from FIG. 16 that the first gate electrode 1401 made of polysilicon and the second gate electrode 201 made of Al are connected together at the thorough hole TH formed through the interlayer insulating film 1501 to thereby form a two-layer electrode structure.

Of the two-layer electrode structure, the second gate electrode 201 made of Al extends to form the gate electrode wiring 202. As shown in FIG. 17, the gate electrode wiring 202 made of Al crosses the drain electrode wiring 203, with the interlayer insulating film 110 being interposed therebetween.

FIGS. 18A to 18G are cross sectional views of a substrate illustrating processes of forming the gate electrode wiring of the comparative example shown in FIGS. 14 to 17. The issue to be solved by the invention will be further described in detail with reference to the cross sectional views of FIGS. 18A to 18G.

Figure 18A:
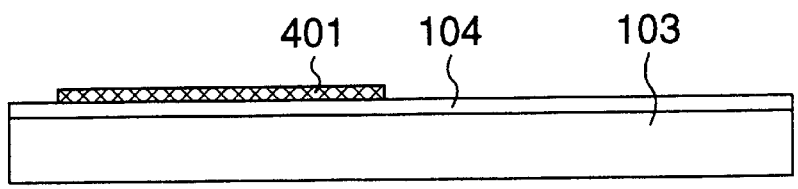
FIGS. 18A to 18G are cross sectional views of a substrate illustrating processes of forming a gate electrode wiring pattern according to the comparative example of the invention shown in FIG. 14.

First, as shown in FIG. 18A, the island pattern 401 made of the intrinsic polysilicon film is formed on the underlying film 104 on the glass substrate 103. This island pattern is generally formed by depositing an amorphous silicon film through CVD or the like and polycrystallizing it through thermal annealing, laser annealing or the like.

Figure 18B:
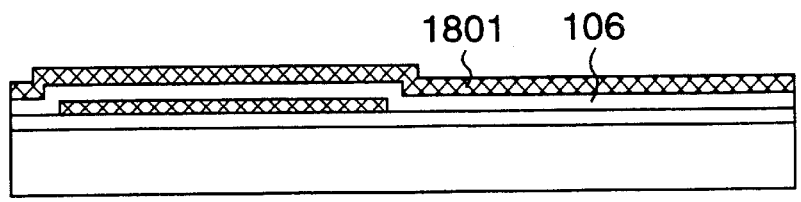

Next, as shown in FIG. 18B, the gate insulating film 106 and the amorphous silicon film 1801 are formed over the whole substrate surface, the amorphous silicon film 1801 being used as the first gate electrode after it is polycrystallized in a process to be described later. The gate insulating film 106 is generally an $SiO_2$ film, an SiN film, or the like formed through CVD.

Figure 18C:
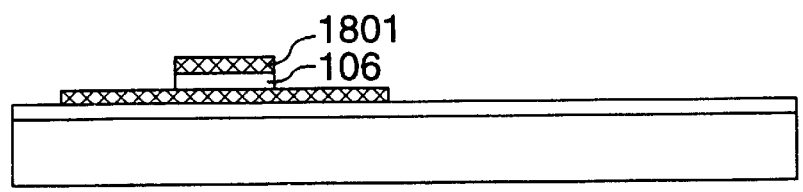

Next, as shown in FIG. 18C, both the gate insulating film 106 and amorphous silicon film 1801 are etched in succession into the same pattern. In order to execute such a process, it is necessary for the first gate electrode to be made of electrode wiring material easy to be dry-etched together with the gate insulating film 106.

Figure 18D:
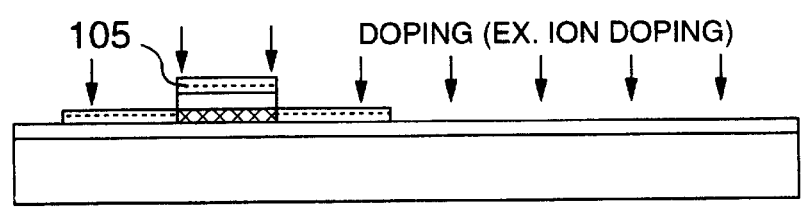

Next, as shown in FIG. 18D, phosphorous ions as n-type dopant are doped into the whole substrate surface. In this case, the lamination pattern of the gate insulating film 106 and amorphous silicon film 1801 is used as a mask so that the channel region 105 made of the intrinsic polysilicon film can be formed in a self-alignment manner.

Boron ions as p-type dopant are selectively doped into areas of p-type TFT's of the peripheral circuit by using a photoresist pattern or the like as a mask. Phosphorous and boron ions are doped through ion implantation or ion doping.

Figure 18E:
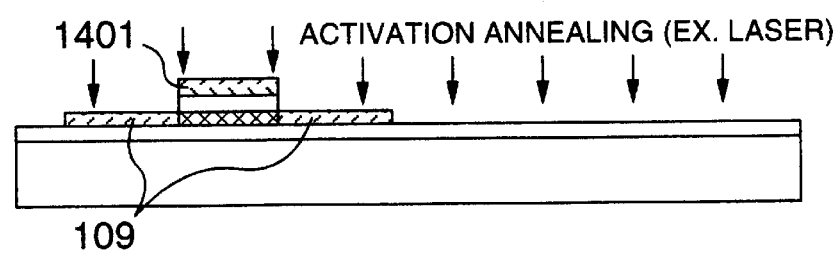

Next, as shown in FIG. 18E, the doped ions are activated through annealing to thereby form the poly-silicon gate electrode 1401 and drain/source active regions 109. The annealing is performed through thermal annealing, laser annealing or the like. The temperature of thermal annealing is generally 600° C. or higher, and in the case of laser annealing, the surface temperature of a silicon film reaches about 1000° C. Therefore, the first gate electrode is required to have heat resistance to such an activation annealing process. For example, Al which is commonly used as the electrode wiring material cannot be used because it has a low melting point metal as described earlier. It is also necessary that the first gate electrode is made a low stress film because it is subject to thermal distortion. Although chromium (Cr) is a high melting point metal (melting point: 1860° C.), it has a high film stress so that cracks are formed in the electrode after the activation annealing.

Although the gate electrode 1401 made of polysilicon is doped with impurities, it has a higher resistance than metal so that it cannot be used as the gate wiring 202 which extends in the most area of the display device. It is therefore necessary to from the second gate electrode wiring made of low resistance metal and connected to the first gate electrode 1401 made of polysilicon.

If the Al film 201 as the second gate electrode wiring is formed at the stage (FIG. 18E) with the exposed TFT, TFT is contaminated causing defective TFT characteristics such as a threshold value shift and an off-set current increase.

Figure 18F:
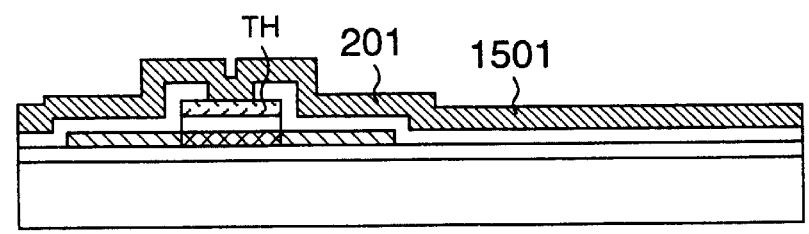
Figure 18G:
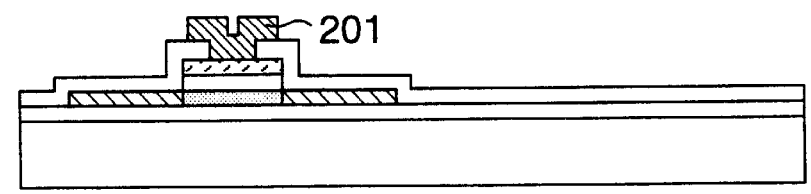

To solve this problem, next, as shown in FIG. 18F, the interlayer insulating film 1501 is formed over the whole substrate surface. The interlayer insulating film 1501 serves as a protective film for preventing TFT from being made in contact with the Al film 201 as the second gate electrode wiring, and is generally an $SiO_2$ film, an SiN film or the like formed through CVD. Although not shown in FIG. 18F, the other interlayer insulating film 110 is formed on the second gate electrode wiring 201, by a process similar to that of the interlayer insulating film 1501. These interlayer insulating films are formed through plasma CVD at a high temperature of 200 to 400° C. A problem therefore arises that the surface of the Al film is oxidized easily.

Instead of Al of the first and second gate electrode wirings, the high melting point metal Nb (melting point: 2470° C.) described in JP-A-7-147852 was used which is an electrode wiring material having a low resistance, a low stress, and easy to dry-etch. Although the resistance value of the Nb film immediately after it was formed was low, the measured resistance value rose after the insulating film was formed. The reason for this is that since the insulating film of an $SiO_2$ film or an SiN film is formed on the Nb wiring film through plasma CVD at a high temperature of 200 to 400° C., the surface of the Nb film is oxidized and a niobium oxide having a high resistance is formed. The insulating film, particularly the $SiO_2$ film, raised the resistance because the Nb film surface was exposed to a strong oxidizing plasma atmosphere.

Figure 19:
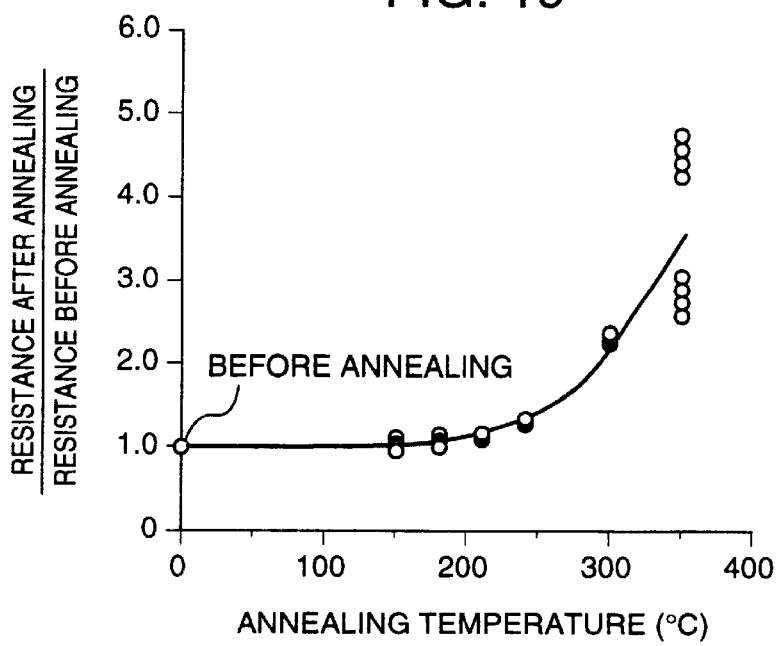
FIG. 19 is a graph showing a resistance change of an Nb film relative to an annealing temperature.

An example of a resistance rise to be caused by thermal oxidation is shown in the graph of FIG. 19 which shows a resistance change (along the abscissa) of an Nb film relative to an annealing temperature. A resistance rise ratio (along the ordinate) of the Nb film subject to annealing in an oven for 1 hour at each temperature in the atmospheric air, is indicated by a ratio of a resistance after annealing to a resistance before annealing. As seen from this graph, the resistance of the Nb film starts rising near at 180° C., and increases abruptly at a temperature higher than 250° C. The resistance rise ratio at 300° C. is about 2.5 times and that at 350° C. is 4.5 times. This resistance rise ratio is consistent with a tendency of a resistance rise of an Nb electrode wiring of an actually formed TFT element. A high wiring resistance is a critical issue of a liquid crystal display device, and the high wiring resistance becomes fatal to, particularly an active matrix type liquid crystal display device. If any approach to improving resistance to thermal oxidation of an Nb film is not incorporated, it is difficult to realize a wiring made of metal material of Nb or alloy containing Nb as its main component. Except for plasma CVD, there exists a method of fabricating an insulating film for TFT, for example that the substrate is coated with inorganic polymer of perhydropolysilazan etc. soluble in organic solvent by spin coating to form $SiO_2$. In the coating, a sintering process is indispensable for improving a quality of the film. Further, the improvement in the resistance to the thermal oxidation is also necessary.

With reference to FIGS. 20 to 27, the configuration and effects of a lamination film structure of first and second layers will be described with respect to their principles, the first layer being made of Nb or alloy containing Nb as its main component and the second layer being made of nitride of Nb or alloy containing Nb as its main component.

In the following, the "Nb or alloy containing Nb as its main component" is called an "Nb series", and the "nitride of Nb or alloy containing Nb" is called an "NbN series". A lamination of the Nb and NbN series are indicated by using "/" as a separator. In this specification, a lamination structure having the first layer (lower layer) of Nb series and the second layer (upper layer) of NbN series is called an Nb series/NbN series lamination structure.

Figure 20:
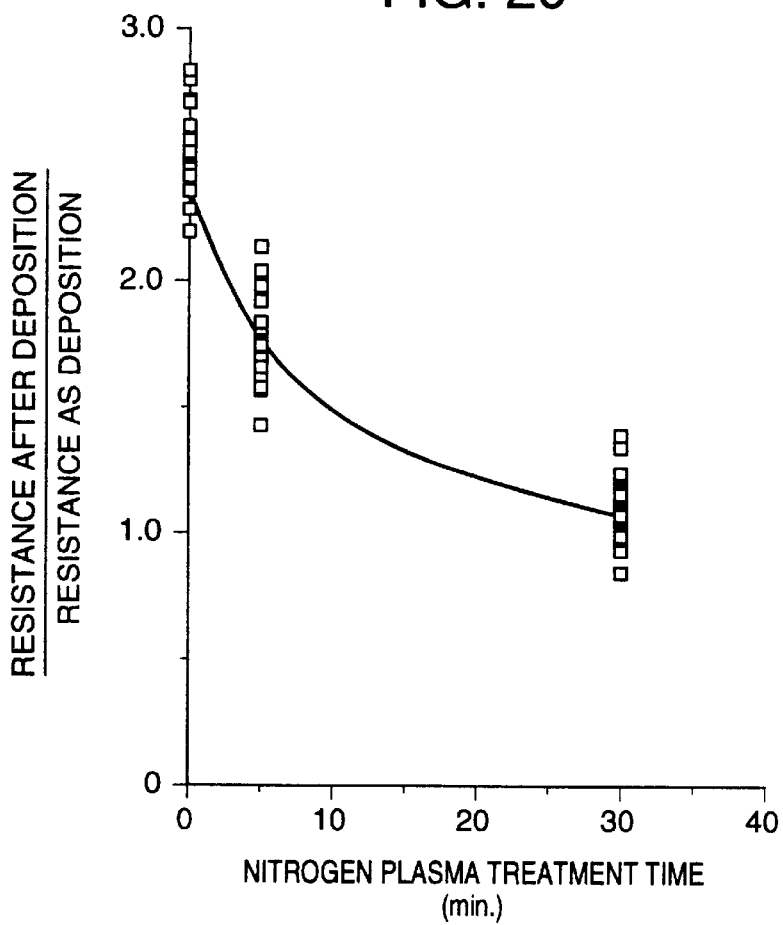
FIG. 20 is a graph showing a resistance change of an Nb film relative to a surface nitrogen plasma treating time.

FIG. 20 is a graph showing a resistance change of a lamination film of an Nb nitride film and an Nb film covered with an $SiO_2$ film, the Nb nitride film being formed by plasma nitrifying the surface of the Nb film.

The Nb film was formed to a thickness of 200 nm through DC magnetron sputtering under the conditions of a substrate temperature of 130° C., an Ar gas flow rate of 60 sccm, a power of 2100 W, and a pressure of 0.2 Pa. It was confirmed that the stress of the Nb film formed under the above conditions was almost zero. The surface of the Nb film was plasma nitrified under the conditions of an $N_2$ gas flow rate of 200 sccm, a power of 500 W, and a pressure of 27 Pa. The lamination film was evaluated by changing the nitrogen plasma treatment time.

The $SiO_2$ film was formed to a thickness of 300 nm through RF plasma CVD under the conditions of a substrate temperature of 330° C., a TEOS (tetraethoxysilane) :$O_2$ gas flow rate ratio=15:3000 sccm, a power of 1000 W, and a pressure of 133 Pa. The above $SiO_2$ film forming conditions are commonly used as TFT processes.

The abscissa of FIG. 20 represents a nitrogen plasma treatment time. The longer the process time, the thicker the NbN film formed on the Nb film surface. A value at the process time 0 indicates a resistance rise ratio of an Nb single layer. The ordinate of FIG. 20 represents a ratio of a resistance rise as a ratio of a resistance as depo (deposition) to a resistance after the $SiO_2$ film is formed. As seen from the graph, the Nb film at the process time 0 has a resistance rise about 2.5 times because it is exposed to a strong oxidizing plasma atmosphere at 330° C. when the $SiO_2$ film is formed, whereas the Nb film at the treatment time of 30 minutes has hardly a resistance rise. It is to be noted that the Nb series/NbN series lamination film structure has a resistance to thermal oxidation higher than the Nb series single layer. It is therefore possible to form the interlayer insulating film of $SiO_2$ in a strong oxidizing plasma atmosphere, without increasing the resistance. The obtained Nb series/NbN series lamination film has a high melting point and a low stress similar to the Nb series single layer. There is therefore no fear that hillocks or whiskers like Al electrode wiring are formed. In addition, when the $SiO_2$ film is formed by coating, the effect of improving the resistance to the thermal oxidation is confirmed similarly. Concretely explaining, for example, after perhydropolysilazan diluted by cycrohexan is coated by spin coating method, the sintering process is applied at 400° C. in atmosphere during one hour. Then, we confirmed that we cannot recognize an increase of the resistance of the stacked films of Nb series/NbN series.

Figure 23:
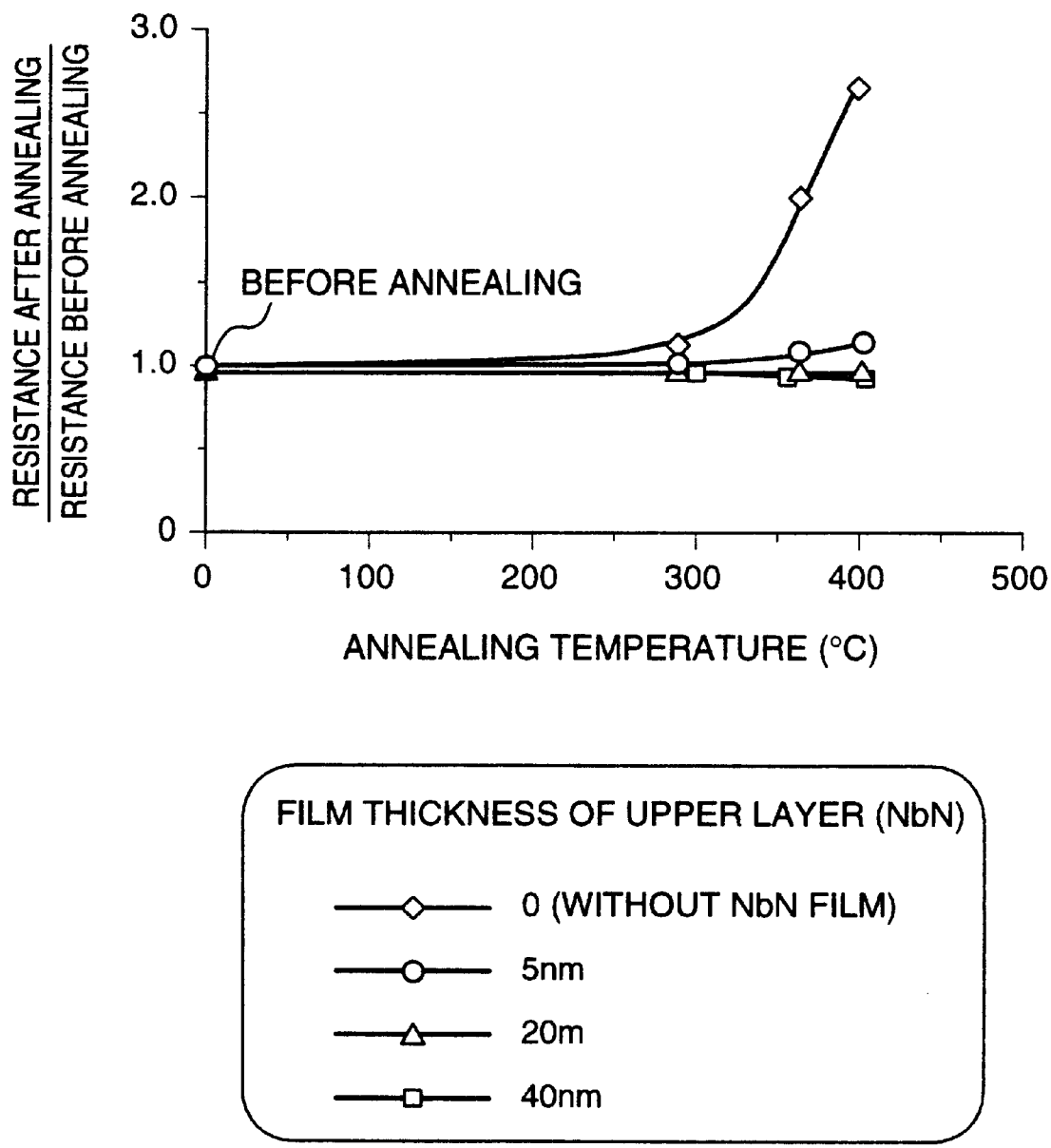
FIG. 23 is a graph showing a resistance change of an Nb series/NbN series lamination film relative to an annealing temperature.

Although the thickness of the NbN series upper layer will be described later with reference to FIG. 23, the effects of improving resistance to thermal oxidation was confirmed at a film thickness of 5 nm or more, and the thicker the film, the effects tended to be improved more. However, since the specific resistance of the NbN series film is larger than the Nb series film, it is not preferable to make too large the thickness of the NbN series film because the resistance of the Nb series/NbN series lamination wiring increases. It is preferable to set the thickness of the NbN series film to a range from 5 nm or more to 100 nm or less. Conversely, if the wiring resistance at the specific resistance level of the NbN series film does not pose a practical problem, the wiring may be made of the NbN series single layer by omitting the lower Nb series film.

It is desired to set the specific resistance of the lower Nb series film to 20 $\mu\Omega$cm or smaller. An Nb series film having a resistance higher than this value contained a large amount of oxygen already during the film formation process, and the effects of the Nb series/NbN series lamination film were not obtained.

Figure 28:
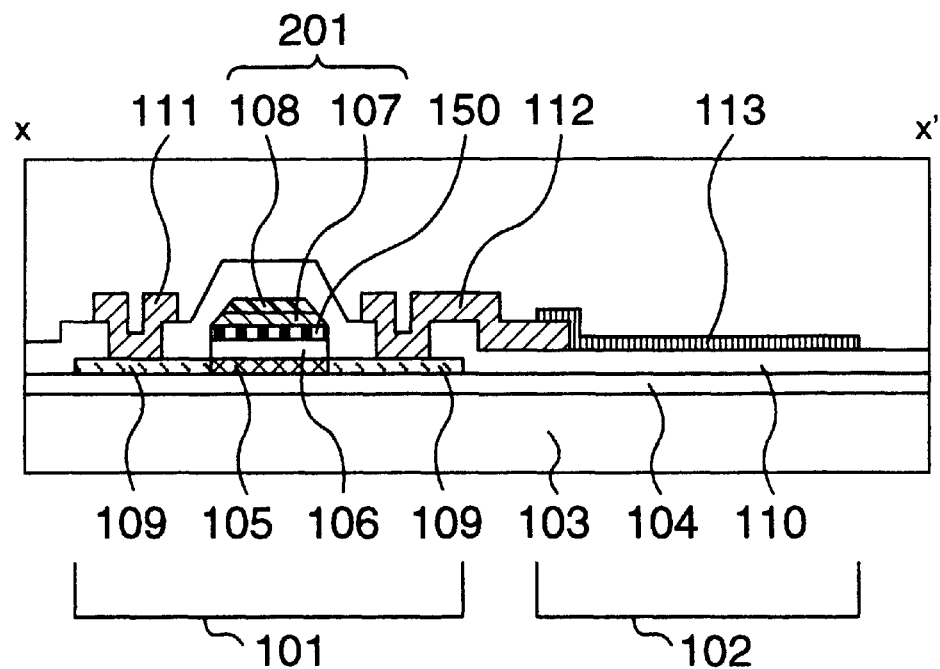
FIG. 28 is a cross sectional view of a wiring pattern made of an NbN series/Nb series/NbN series lamination film.
Figure 29:
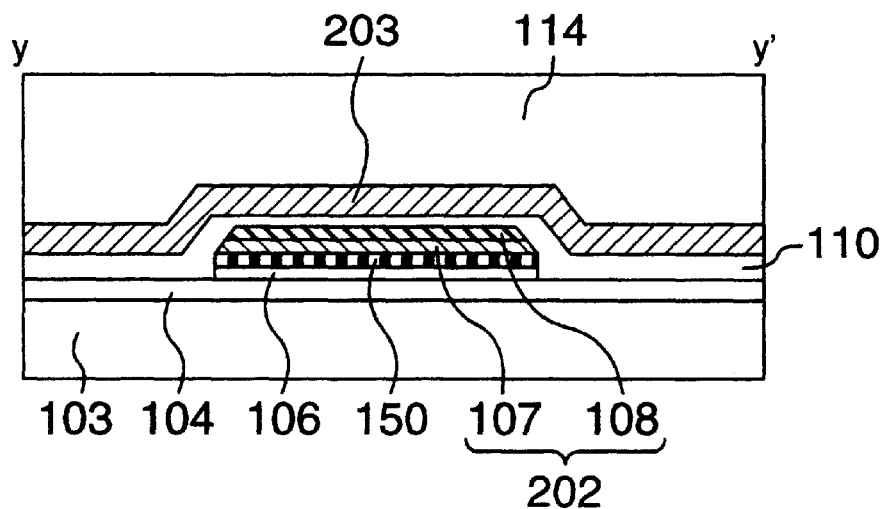
FIG. 29 is a cross sectional view of a wiring pattern made of an NbN series/Nb series/NbN series lamination film.

As an example of application of this Nb series/NbN series lamination film, there is a three-layer lamination film formed on an insulating film such as shown in FIGS. 28 and 29. This lamination film has a third layer 150 made of Nb nitride or alloy nitride containing Nb nitride as its main component, a first layer 107 made of Nb or alloy containing Nb as its main component, and a second layer 108 made of Nb nitride or alloy nitride containing Nb nitride as its main component. Since the Nb series film is not in direct contact with the insulating film but the NbN based film is interposed, the quality of the Nb film is not lowered by oxygen diffused from the insulating film. Further, an adhesion between the Nb series/NbN series stacked film and the insulating film is improved by adding NbN series film to the lower layer.

Similar to the thickness of the upper NbN series film, it is preferable to set the thickness of the lower NbN series film to a range from 5 nm or more to 100 nm or less.

In addition to a method of nitrifying the surface of the Nb series film to form the Nb series/NbN series lamination film, other methods may be used by devising a sputtering system such as using a sputtering system of a multi-chamber single wafer processing type. By using such a sputtering system, the Nb series/NbN series lamination film can be formed in succession so that an increase of the number of processes to be caused by formation of the NbN series film can be avoided. In addition to the above method of forming the Nb series/NbN series lamination film, this film may be formed by forming an NbN series film through sputtering using a target of Nb series nitride on an Nb series film formed through sputtering using an Nb series target. Alternatively, an NbN series film may be formed through reactive sputtering using an Nb series target and a sputtering gas added with nitrogen ($N_2$). Further, an NbN series film may be formed by nitrifying the surface of an Nb series film through laser annealing in a nitrogen atmosphere. With any of the above methods, the Nb series/NbN series lamination film can be formed in succession without increasing the number of processes. Not only the Nb film but also the film containing Nb as it main component can form nitride by the above methods, and it is obvious that similar resistance to thermal oxidation can be obtained. FIG. 23 shows a resistance change of an Nb series/NbN series lamination film relative to an annealing temperature. The Nb series/NbN series lamination film is formed through reactive sputtering illustrated in FIGS. 21 and 22. The abscissa of FIG. 23 represents an annealing temperature of the Nb series/NbN series stacked film in the unit of ° C., and the ordinate thereof represents the resistance change as a resistance rise ratio of a resistance after annealing to a resistance before annealing when the thermal process is performed by changing the annealing temperature. As the parameter of this graph, the thickness of the upper NbN series film is used. Specifically, a line with a rhombus mark corresponds to an absence of the upper NbN series film, i.e., a thickness of 0 nm of the upper NbN series film. A line with a circle mark corresponds to a thickness of 5 nm of the upper NbN series film. A line with a triangle mark corresponds to a thickness of 20 nm of the upper NbN series film. A line with a square mark corresponds to a thickness of 40 nm of the upper NbN series film. As seen from the graph shown in FIG. 23, a sufficient resistance to thermal oxidation can be retained even for an annealing treatment at 400° C. by laminating an NbN series film having a thickness of 5 nm or more on the Nb series film. There is a tendency that the thicker the NbN series film, the more the resistance to thermal oxidation can be improved, although the effects of improving the resistance change are gentle. When the resistance of the NbN series film itself is taken into consideration, it is preferable as described earlier that the thickness of the NbN series film of the Nb series/NbN series lamination film is set in a range from 5 nm or more to 100 nm or less.

Figure 21:
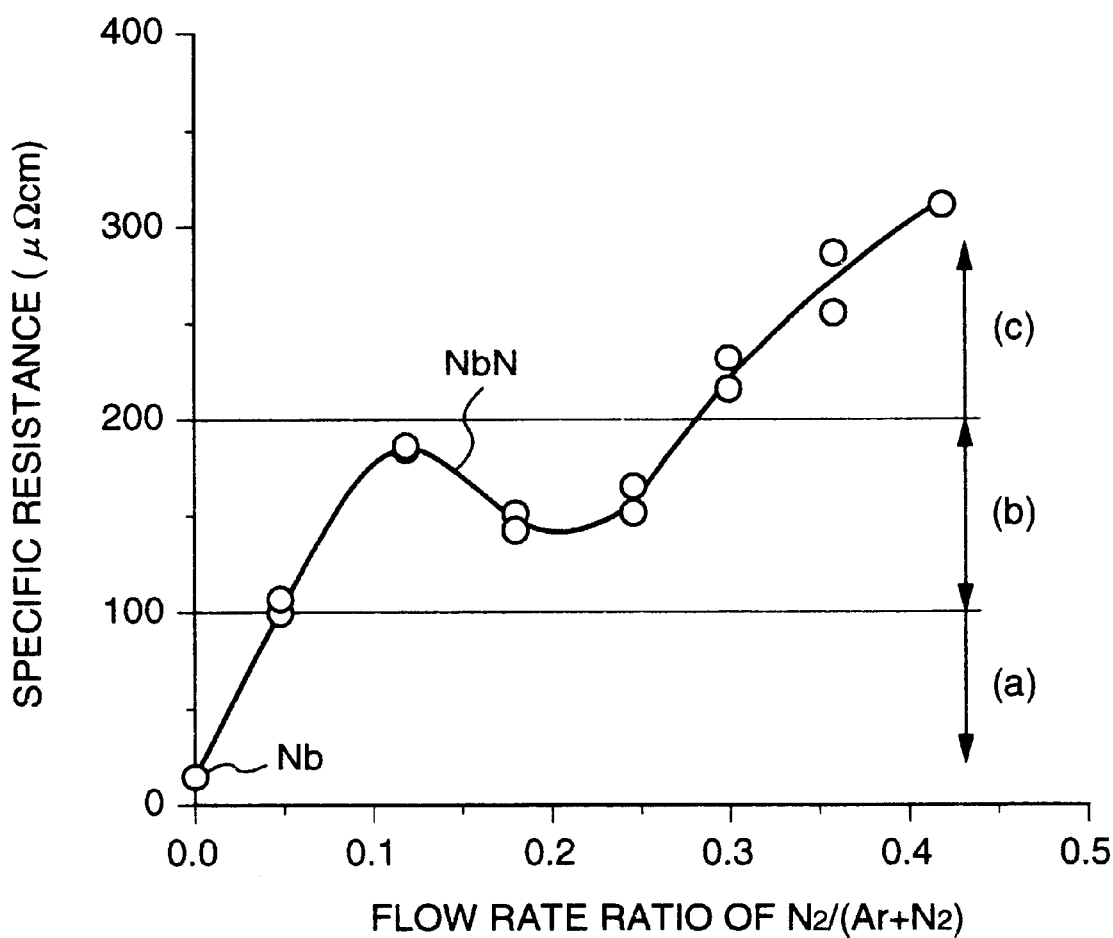
FIG. 21 is a graph showing a specific resistance change of an Nb nitride film (NbN series) as a function of an $N_2$ content.

FIG. 21 is a graph showing a specific resistance of an NbN series film relative to a sputtering gas flow rate ratio. The NbN film was formed through reactive sputtering using a sputtering gas added with $N_2$. The abscissa of the graph shown in FIG. 21 represents an $N_2/(Ar+N_2)$ flow rate ratio of $N_2$ to the sputtering gas Ar added with $N_2$, and the ordinate thereof represents the specific resistance ($\Omega$cm) of the NbN series film. The NbN series film was formed under the conditions of a substrate temperature of 130° C., a total gas flow rate of 60 sccm, a power of 2100 W, and a pressure of 0.5 Pa. In order to form an Nb series/NbN series lamination film contributing to improvement of resistance to thermal oxidation, it was confirmed that the NbN series film was suitable which was formed under the conditions of an $N_2$ addition amount in a range of an $N_2/(Ar+N_2)$ flow rate ratio of 0.05 to 0.25 and an NbN series film specific resistance in a range (indicated at (b) in FIG. 21) from 100 to 200 $\mu\Omega$cm. The specific resistance of the NbN series film without addition of $N_2$ (flow rate ratio=0) was 18 $\mu\Omega$cm.

The film structure at each point shown in FIG. 21 was inspected through x-ray diffraction spectroscopy. It was found that the structures in the three regions indicated at (a), (b), and (c) in FIG. 21 were different.

Figure 22:
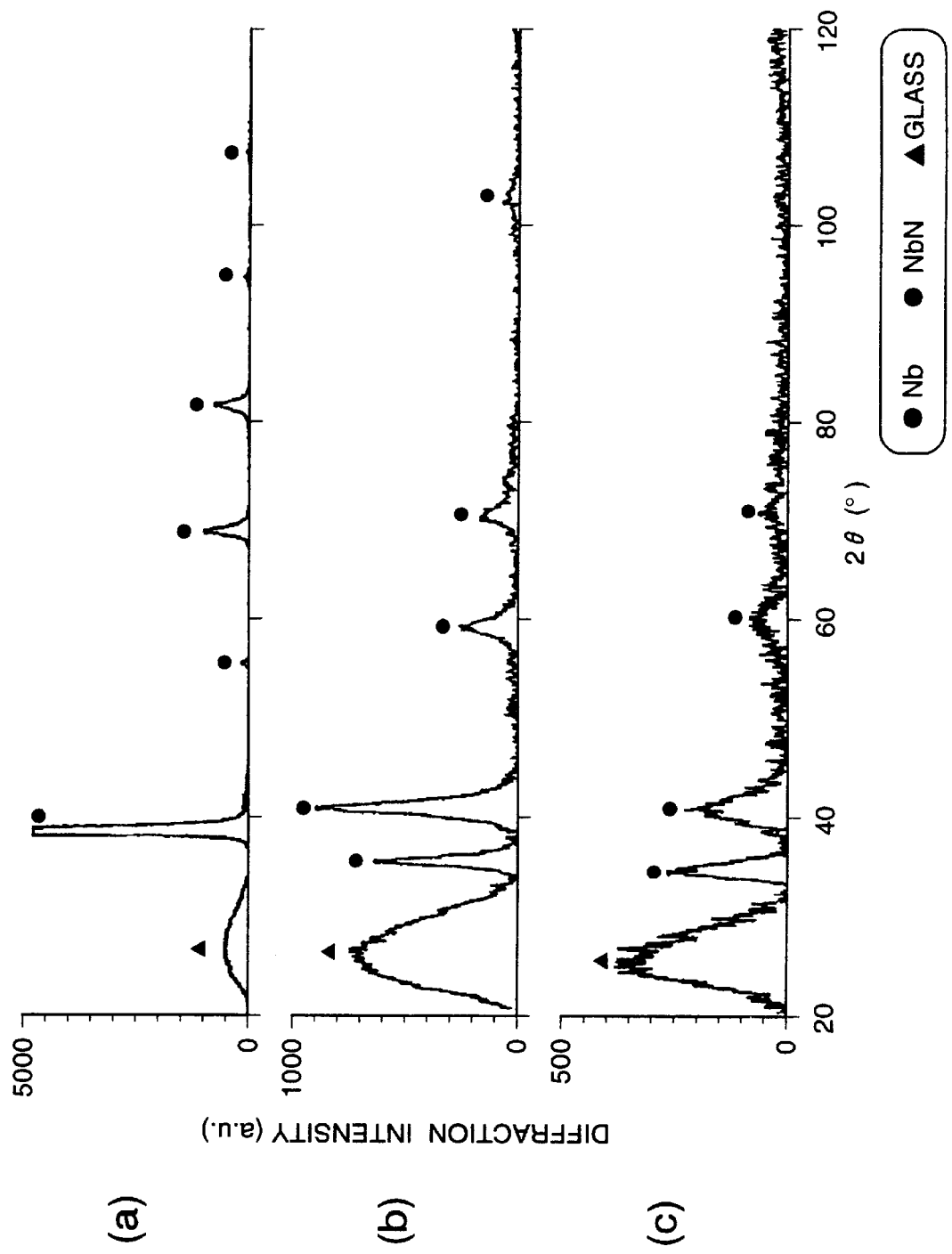
FIG. 22 is an X-ray diffraction spectrum diagram of the Nb nitride film (NbN series) doped with $N_2$ shown in FIG. 21.

FIG. 22 shows x-ray diffraction spectra (representative examples) of the Nb nitride films (NbN series film) selected from the three regions (a), (b), and (c) shown in FIG. 21. The ordinate represents an x-ray diffraction strength in the arbitrary unit or a.u. In FIG. 22, a solid black circle represents cubic Nb, a hollow circle represents a crystal peak of cubic NbN, and a solid black triangle represents an amorphous peak of the underlying glass substrate. It was found that a film in a range (a) shown in FIG. 21 where the $N_2/(Ar+N_2)$ flow rate ratio is smaller than 0.05 and the NbN film specific resistance is smaller than 100 $\mu\Omega$cm, was in a state of an Nb single phase or a mixed crystal state of NbN and Nb, because of insufficient addition of $N_2$.

In contrast, it was found that a film in a range (b) shown in FIG. 21 where the $N_2/(Ar+N_2)$ flow rate ratio is in a range from 0.05 to 0.25 and the NbN film specific resistance is in a range from 100 to 200 $\mu\Omega$cm, was made of only NbN having a good crystallinity. It was also found that a film in a range (c) shown in FIG. 21 where the $N_2/(Ar+N_2)$ flow rate ratio is larger than 0.25 and the NbN film specific resistance is larger than 200 $\mu\Omega$cm, was made of only NbN having, however, a small crystal peak and a poor crystallinity because of excessive addition of $N_2$. A difference between the effects of improving resistance to thermal oxidation of the Nb series/NbN series lamination film may be ascribed to such a difference between film qualities.

It is desired that a lamination wiring structure of a gate wiring can be etched in succession without increasing the number of processes. Therefore, if the Nb series/NbN series lamination film is used, it is desired that the film can also be etched in succession. As will be later described with reference to FIGS. 6 to 9, it is necessary to form through holes through the interlayer insulating film 110 on the gate electrodes 201 in the TFT area where CMOS inverters are formed and in the terminal forming area of the active matrix. It is therefore necessary to satisfy the conditions that the interlayer insulating film 110 on the Nb series/NbN series lamination film can be selectively etched. As described earlier, an $SiO_2$ film or an SiN film is used as the interlayer insulating film 110.

Figure 24:
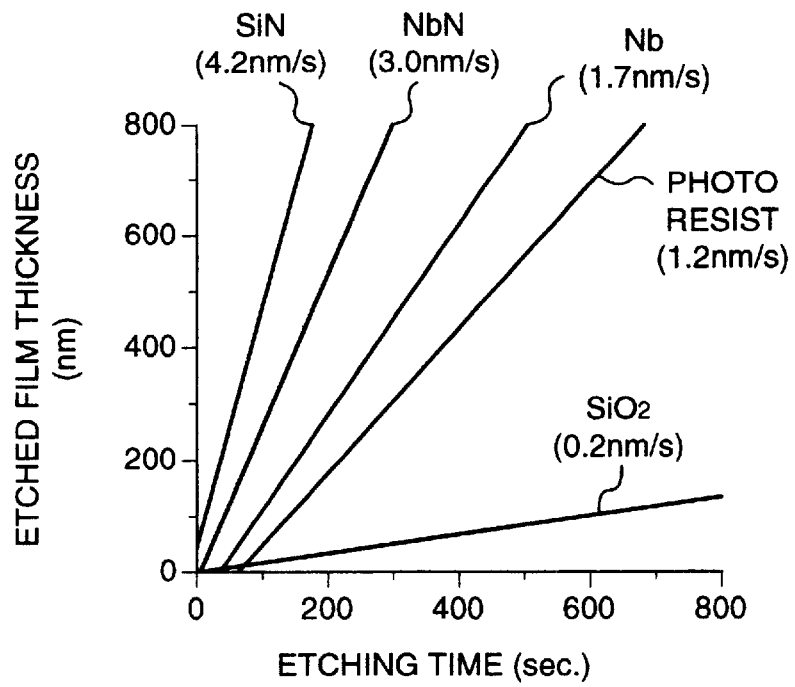
FIG. 24 is a graph showing a relation between an etching time and etched film thicknesses of Nb, NbN, $SiO_2$, SiN, and resist respectively etched with $SF_6$.

FIG. 24 is a graph showing the evaluation results of etching rates of an Nb film, an NbN film, an $SiO_2$ film, an SiN film, and a photoresist film when these films are etched with $SF_6$ gas which is a typical one of F-based etching gases. The abscissa of FIG. 24 represents an etching time (second), and the ordinate thereof represents an etched film thickness (nm). The Nb film, NbN film, and $SiO_2$ film were formed by the methods described with FIGS. 20 to 23. The SiN film was formed through RF plasma CVD under the conditions of a substrate temperature of 230° C., a gas flow rate ratio of $SiH_4$ (monosilane):$NH_3$ (ammonium):$N_2$=20:60:200 sccm, a power of 175 W, and a pressure of 80 Pa. The resist film was made of commercially available positive type photoresist. The etching process was performed by using an RF parallel plate type reactive ion etching system, under the conditions of a power of 500 W, a pressure of 27 Pa, and an $SF_6$ gas flow rate of 88 sccm. The etching rate can be calculated from a slope of the etched film thickness relative to the etching period shown in FIG. 24. It can be seen from the graph that the etching rate becomes fast in the order of $SiO_2$ (0.2 nm/s)<<resist (1.2 nm/s)<Nb series (1.7 nm/s) <NbN series (3.0 nm/s)<SiN (4.2 nm/s). It can be understood from this that the Nb series/NbN series lamination film can be etched in succession by using F-based etching gas.

It can also be understood from this that if the $SiO_2$ film is used as the interlayer insulating film, the Nb series/NbN series lamination film used as the gate electrode wiring may be damaged because the etching rate of the $SiO_2$ film is slower than that of the NbN series film and Nb series film. Selective etching of the $SiO_2$ can be performed if $CHF_3$ to be described later is used as the etching gas in place of $SF_6$. Although the etching rate of the SiN film is faster than that of the NbN or Nb series film, the etching selection ratio relative to the NbN series film is only 1.4. It can be therefore understood that it is practically difficult to selectively etch the SiN film without damaging the Nb series/NbN series lamination film.

It can be understood from the above reason that it is difficult to use the SiN film as the interlayer insulating film. In place of $SF_6$ which is a typical one of F-based etching gases, a $CF_4$ gas and a $CF_4$ gas added with $O_2$ were also used with the same results described above.

Figure 25:
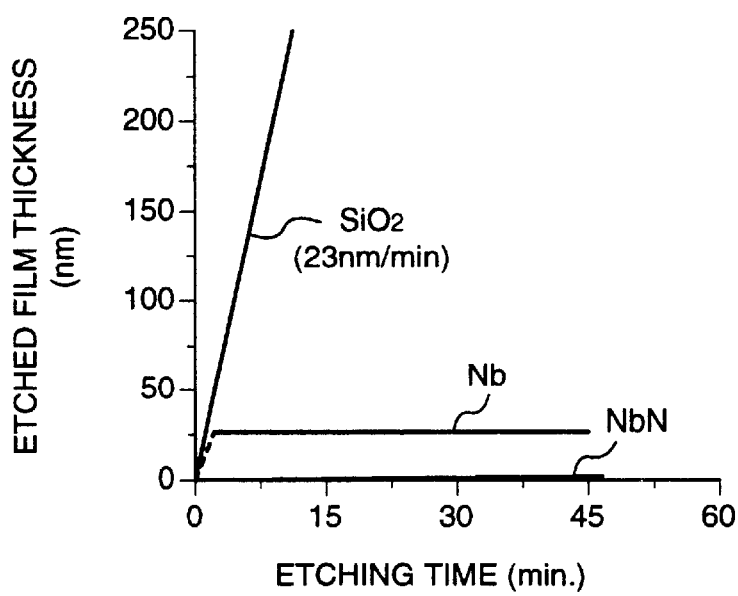
FIG. 25 is a graph showing a relation between an etching time and etched film thicknesses of Nb, NbN, $SiO_2$, SiN, and resist, respectively etched with $CHF_3$.

FIG. 25 is a graph showing the evaluation results of etching rates of an Nb series film, an NbN series film, and an $SiO_2$ film when these films are etched with $CHF_3$ gas. The abscissa of FIG. 25 represents an etching time (minute), and the ordinate thereof represents an etched film thickness (nm). The etching process was performed by using an RF parallel plate type reactive ion etching system, under the conditions of a power of 550 W, a pressure of 6.7 Pa, and an $CHF_3$ gas flow rate of 55 sccm. It can be seen from this graph that the Nb series and NbN series films are hardly etched, with the etching rate of the $SiO_2$ film being set to 23 nm/min. This is because $CHF_3$ is deposition-rich gas. Specifically, during the etching process using $CHF_3$ gas, F radicals contributing to etching and C—F compounds are formed in the plasma, and the C—F compounds are deposited on the surface of the NbN series film so that etching the Nb or NbN series film is stopped. The C—F compounds are not deposited on the $SiO_2$ film because the $SiO_2$ film supplies oxygen which oxidizes and decomposes the C—F compounds. Therefore, etching the $SiO_2$ film progresses constantly. Selective etching of the $SiO_2$ film on the Nb series/NbN series lamination film can therefore be performed by using $CHF_3$ gas. From the dry etching process restrictions described above, it can be understood that an $SiO_2$ film is suitable for use as the interlayer insulating film 110 on the gate electrode wiring 201.

Figure 26A:
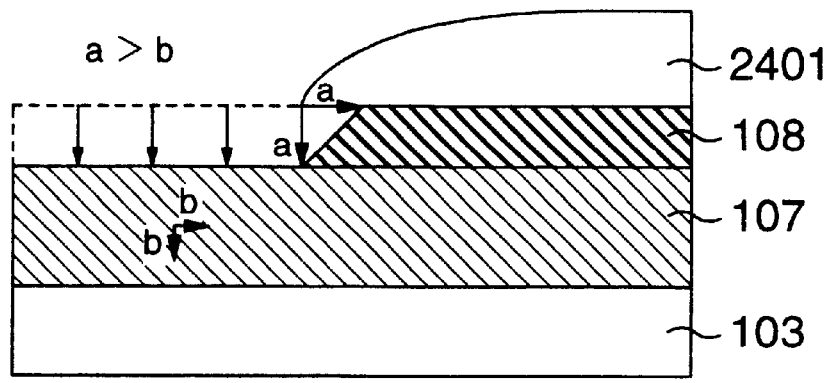
FIGS. 26A to 26D are schematic cross sectional views of a peripheral wall of a wiring pattern made of an Nb series/NbN series lamination film.
Figure 26B:
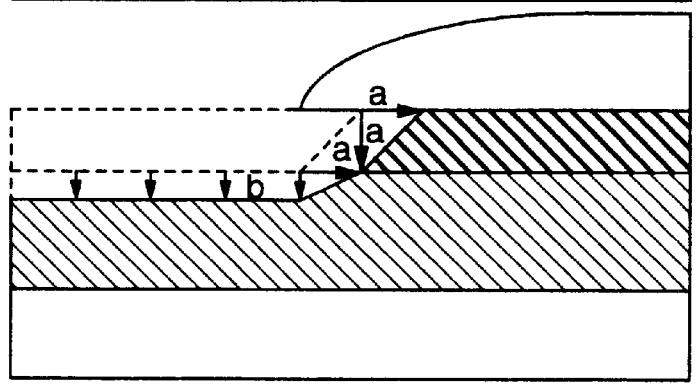
Figure 26C:
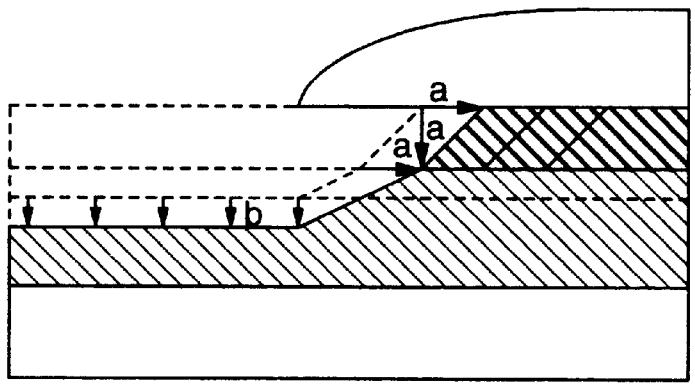
Figure 26D:
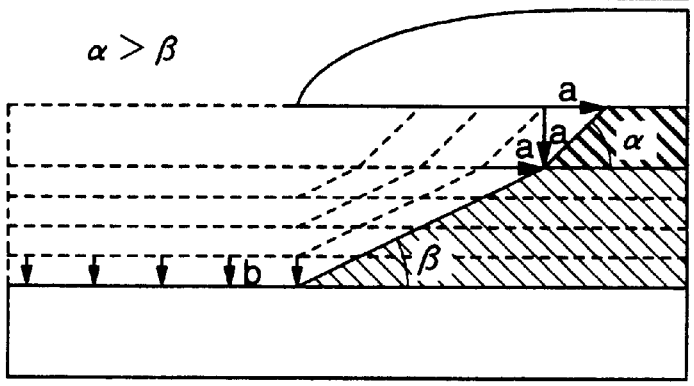

FIGS. 26A to 26D are schematic cross sectional views showing a peripheral wall of the Nb series/NbN series lamination film etched by using the gas described with FIG. 24. In FIGS. 26A to 26D, reference numeral 103 represents the glass substrate, reference numeral 107 represents the Nb series film, reference numeral 108 represents the NbN series film, and reference numeral 2401 represents a photoresist pattern. As shown in FIG. 26A, the NbN series film 108 is considered to be isotropically etched both in the film thickness direction and in the film lateral direction. As described with reference to FIG. 24, the etching rate a of the upper NbN series film 108 of the Nb series/NbN series lamination film is about a twofold of the etching rate in the film thickness lower Nb series film 107 (a>b). Therefore, as shown in FIGS. 26B and 26C, the etching rate in the film thickness direction becomes abruptly small when the etching passes through the interface between the Nb series film and NbN series film and enters the Nb series film. On the other hand, the etching rate in the film lateral direction is still dominated by the etching rate a of the NbN series film. Eventually as shown in FIG. 26D, the peripheral wall of the etched Nb series/NbN series lamination film has a taper shape with different angles at the upper and lower portions separated by the Nb series/NbN series lamination interface. The angle α of the upper NbN series film and the angle β of the lower Nb series film have a relation of α>β. Etching of the Nb series/NbN series lamination film was not actually isotropic etching but the etching rate in the film thickness direction tends to become slightly faster than the etching rate of the film lateral direction. However, the shape of peripheral walls of the etched Nb series/NbN series lamination films were generally similar to the taper shape shown in FIG. 26D, which was confirmed through SEM observation of the cross sections. Such a taper shape applied to the gate electrode wiring ensures a good peripheral portion around the interlayer insulating film 110 and drain electrode wiring 203, so that a short circuit between wirings through the interlayer insulating film and a breakage of a drain line can be prevented. The shape of the peripheral wall of the etched wiring shown in FIG. 26D is therefore essential for the gate electrode wiring.

As will be later described with reference to FIGS. 6 to 9, in the TFT area where complementary MOS (CMOS) inverters are formed, it is necessary to form through contact holes for interconnection between the drain electrode wiring and the Nb series/NbN series lamination film serving as the gate electrode wiring.

Figure 27:
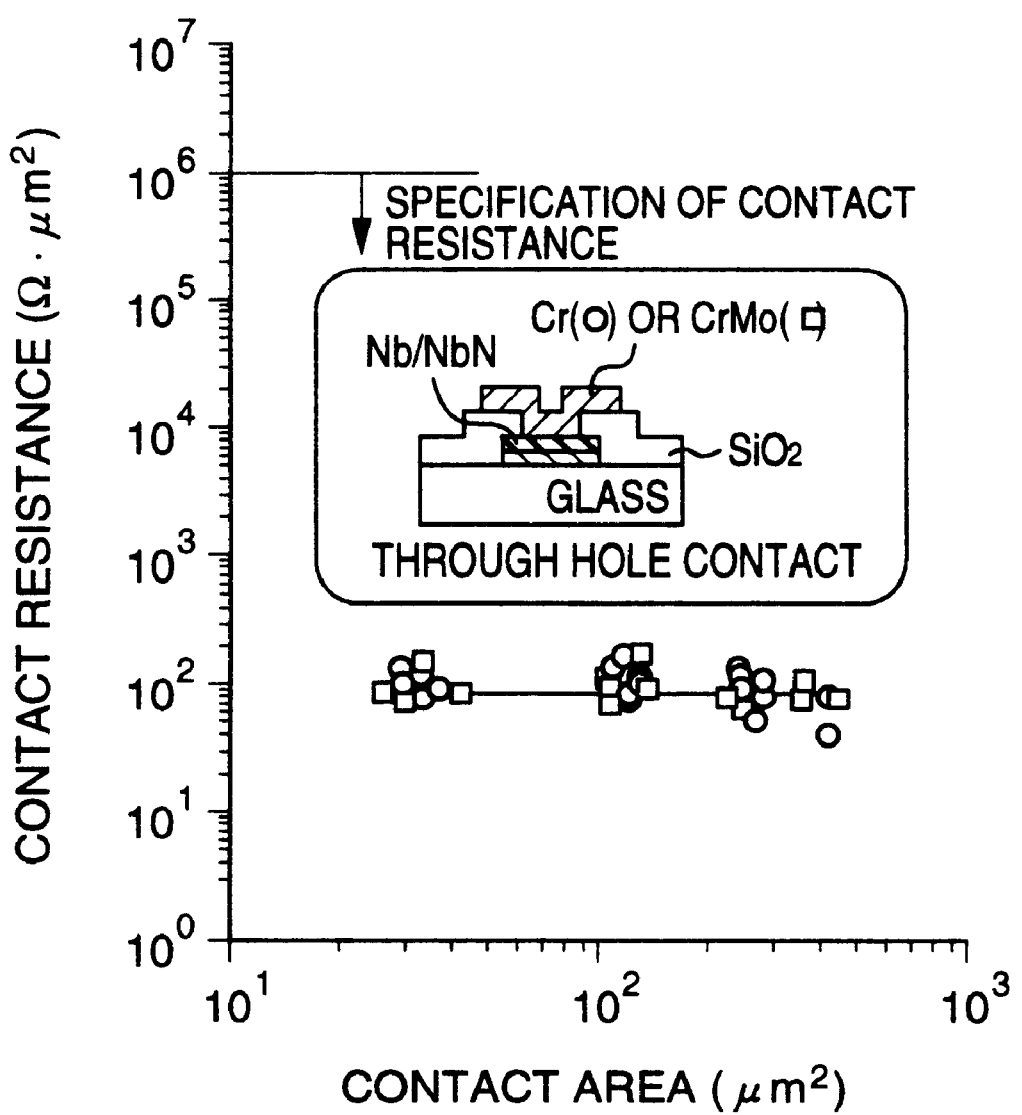
FIG. 27 is a graph and diagram showing an Nb series/NbN series lamination film and a through hole contact resistance of Cr or CrMo.

FIG. 27 shows an Nb series/NbN series lamination film and the measurement results of through contact hole resistances of Cr and alloy of Cr and Mo (hereinafter represented by CrMo alloy). Cr is generally used as the drain electrode wiring material. The abscissa of FIG. 27 represents a contact area ($\mu m^2$ and the ordinate thereof represents a contact resistance ($\Omega \cdot \mu m^2$). The Cr film was formed through DC magnetron sputtering under the conditions of a substrate temperature of 200° C., an Ar gas flow rate of 60 sccm, a power of 4000 W, and a pressure of 0.2 Pa. The CrMo alloy film was formed by using an alloy target of Cr and Mo having a weight percentage of 50:50 under the same conditions as the Cr film. Circle symbols shown in FIG. 27 stand for the measurement results of the Cr film and the Nb series/NbN series lamination film, and square symbols stand for the measurement results of the CrMo film and the Nb series/NbN series lamination film. A target contact resistance is required to be set to $10^6$ $\Omega \mu m^2$ or smaller from the drive conditions of the peripheral circuit and pixel TFT's. As seen from the measurement results shown in FIG. 27, both the combination of the Cr film and the Nb series/NbN series lamination film and the combination of the CrMo film and the Nb series/NbN series lamination film showed the contact resistance of $10^2$ $\Omega \mu m^2$ in a range of the contact area from 25 to 400 $\mu m^2$. This value is lower than the target value by four digits and satisfies the requested specification. It can therefore be concluded that good contact characteristics can be retained by using an Nb series/NbN series lamination film as the gate electrode wiring and a Cr film or a Cr alloy film as the drain electrode wiring. The above good contact characteristics can be achieved if at least a portion of the drain electrode wiring or source electrode wiring connected to the gate electrode wiring made of the Nb series/NbN series lamination film is made of a Cr film or a CrMo alloy film. Therefore, if this condition is satisfied, a lamination film of another metal film, e.g., a low resistance Al alloy film, and a Cr film or a CrMo alloy film, may also be used as the drain or source electrode wiring.

Since the wiring structure of the invention has an excellent resistance to thermal oxidation, it can be used effectively for the drain electrode wiring, source electrode wiring, common electrode if provided, common electrode wiring if provided, and the like which are subject to an oxidizing atmosphere at a high temperature. Next, application of the wiring structure of the invention to the gate electrode wiring of a TFT substrate will be described.

Figure 2:
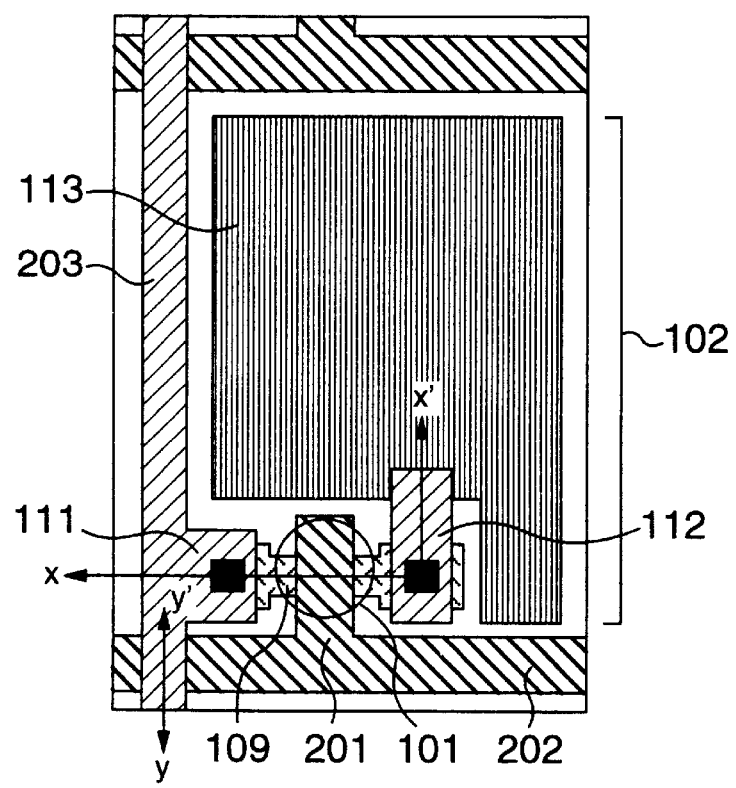
FIG. 2 is a plan view showing a single pixel of the liquid crystal display device of the embodiment shown in FIG. 1.
Figure 3:
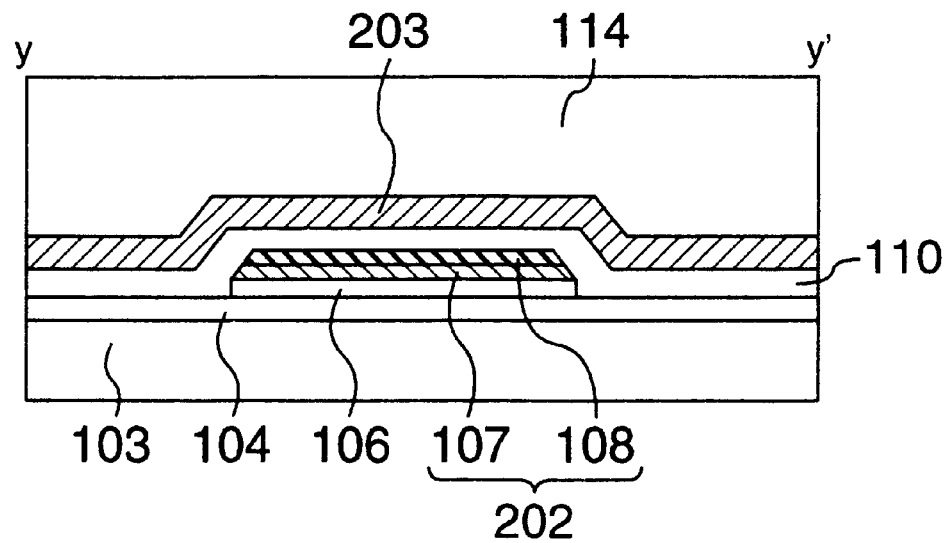
FIG. 3 is a cross sectional view of the liquid crystal display device having coplanar type TFT's taken along line y–y' shown in FIG. 2.

FIG. 2 is a plan view of a single pixel of a liquid crystal display device using coplanar type TFT's according to an embodiment of the invention. FIGS. 1 and 3 are cross sectional views taken along lines x–x' and y–y' shown in FIG. 2.

Similar to the comparative example shown in FIG. 14, the fundamental structure of a single pixel of the liquid crystal display device is constituted of the gate electrode wiring 202 formed on the underlying film 104 on the glass substrate 103, the drain electrode wiring 203 crossing the gate electrode wiring 202, TFT 101 formed near each cross point between the gate and drain electrode wirings, and the pixel display area 102. As different from the comparative example, in place of the two-layer gate electrode structure made of the first gate electrode 1401 of polysilicon and the second gate electrode 201 of Al, the invention adopts a lamination electrode structure of a lamination film (Nb series/NbN series) made of the first layer 107 of Nb or alloy containing Nb as its main component and the second layer 108 of a nitride film of the first layer 107.

Therefore, as shown in FIG. 1, TFT 101 is constituted of the channel region 105 made of an intrinsic polysilicon film, the gate insulating film 106 formed on the channel region 105, the lamination type gate electrode 201 made of the first layer 107 of Nb or alloy containing Nb as its main component and the second layer 108 of a nitride film of the first layer 107, drain/source active regions 109 in the channel region 105 made of the intrinsic polysilicon film 105 and doped with impurities, and the drain and source electrodes 111 and 112 connected via through holes to the drain and source active regions. The source electrode 112 of TFT 101 is connected to the pixel electrode 113. The interlayer insulating film 110 is formed between the gate electrode wiring of TFT 101 and the source/drain electrode wiring. The protective insulating film 111 is formed over TFT 101 and respective wirings. Reference numeral 102 represents a pixel display area.

Similar to the comparative example, the gate electrode 201 extends to form the gate electrode wiring 202.

FIG. 3 shows a cross area between the gate electrode wiring 202 and drain electrode wiring 203. As described earlier with reference to FIG. 26, the peripheral wall of the etched gate electrode wiring 202 made of the lamination film of the first layer 107 of Nb or alloy containing Nb as its main component and the second layer 108 of nitride of the first layer is etched to have a normal taper shape. Such a taper shape of the etched gate electrode wiring 202 ensures a good peripheral portion around the interlayer insulating film 110 and drain electrode wiring 203 on the gate electrode wiring 202, so that a short circuit between wirings and a breakage of the drain electrode wiring 203 can be prevented. Since there is no hillock or whisker like Al electrode wiring, a defective product having a short circuit between wirings can be reduced further.

Figure 4A:
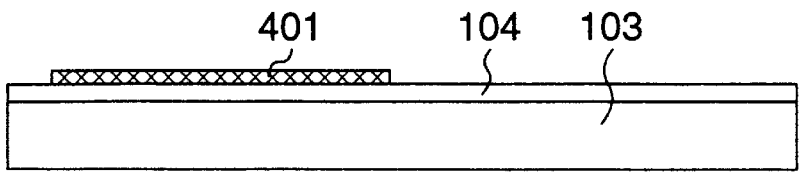
FIGS. 4A to 4E are cross sectional views of a substrate illustrating processes of forming a gate electrode wiring pattern shown in FIG. 2.

FIGS. 4A to 4E are cross sectional views of a substrate illustrating processes of forming the gate electrode wiring shown in FIGS. 1 to 3 according to the embodiment. First, as shown in FIG. 4A, the island pattern 401 made of the intrinsic polysilicon film is formed on the underlying film 104 on the glass substrate 103.

Figure 4B:
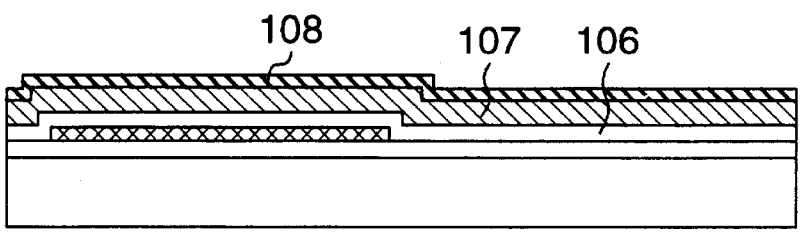
Figure 4C:
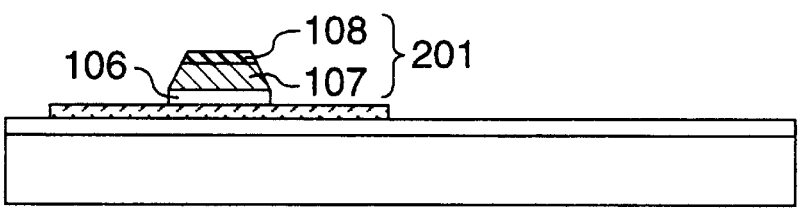

Next, as shown in FIG. 4B, a lamination film is deposited over the whole substrate surface, the lamination film including the gate insulating film 106, the first layer 107 made of Nb or alloy containing Nb as its main component, and the second layer 108 of nitride of the first layer. The second layer 108 of nitride of the first layer can be formed in succession with the first layer 107 made of Nb or alloy containing Nb as its main component, by forming a nitride film through reactive sputtering using a mixture gas of Ar and $N_2$. Next, as shown in FIG. 4C, the lamination film constituted of the gate insulating film 106, the first layer 107 made of Nb or alloy containing Nb as its main component, and the second layer 108 of nitride of the first layer, are etched in succession into the same pattern to form the lamination type gate electrode 201 and the gate insulating film 106 having generally the same plane shape as the gate electrode pattern 201.

As described earlier with reference to FIG. 24, the first layer 107 made of Nb or alloy containing Nb as its main component and the second layer 108 of nitride of the first layer can be easily etched in succession by using F-based etching gas.

Figure 4D:
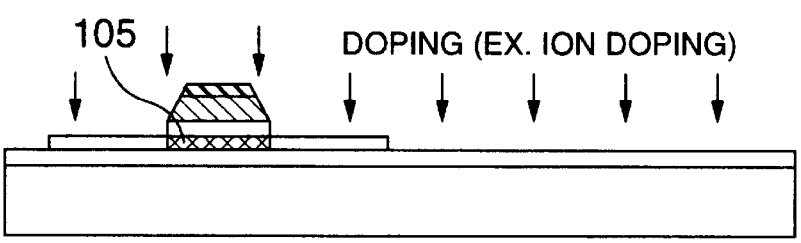

Next, as shown in FIG. 4D, phosphorous ions as n-type dopant are doped into the whole substrate surface. In this case, the lamination pattern of the gate insulating film 106 and lamination type gate electrode 201 is used as a mask so that the channel region 105 made of the intrinsic polysilicon film can be formed in a self-alignment manner.

Figure 4E:
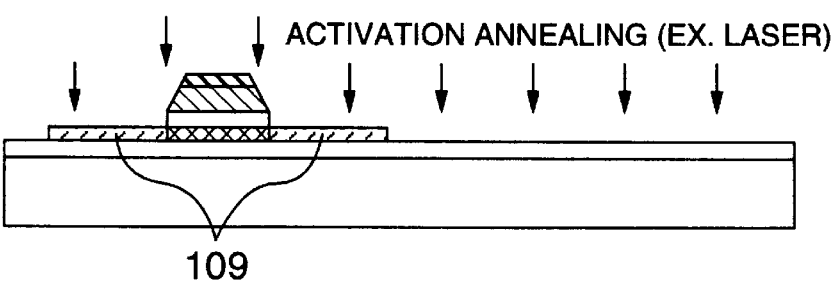

Lastly, as shown in FIG. 4E, activation annealing is performed to activate the doped impurity ions and form the source and drain active regions 109. The annealing is performed through thermal annealing, laser annealing or the like. Since the Nb series/NbN series lamination film constituting the lamination type gate electrode 201 has a high melting point and a low stress, defects such as a peel-off of the gate electrode wiring, cracks, and the like are not formed during the activation annealing. Since the gate electrode wiring has the Nb series/NbN series lamination film structure, a resistance to thermal oxidation in an activation annealing atmosphere can be improved. Even during the later process of forming the interlayer insulating film 110, the resistance of the gate electrode wiring is not raised.

Since the Nb series/NbN series lamination film has a resistance considerably lower than the gate electrode 1401 of polysilicon of the comparative example described with reference to FIG. 14 to FIG. 18G, the lamination type gate electrode 201 only can be used as signal wirings in the liquid crystal display device. Accordingly, the second gate electrode wiring made of low resistance metal of the comparative example is not necessary. The interlayer insulating film 1501 preventing TFT from becoming in contact with the second gate electrode wiring 201 becomes therefore unnecessary so that the gate electrode wiring structure and total processes can be simplified greatly. In other words, by adopting the lamination gate electrode wiring structure of the invention, a simple gate electrode wiring structure can be realized which is excellent in resistance to thermal oxidation, good patterning characteristics, in process workability and integrity and has a low resistance and a low stress, while the advantages of metal material Nb and alloy containing Nb as its main component are positively utilized. Since the TFT structure and processes can be simplified considerably, a liquid crystal display device of low cost can be provided.

Since the short circuit between wirings at their cross area and a breakage of the drain electrode wiring can be avoided, a manufacture yield of liquid crystal display devices can be improved.

Figure 5:
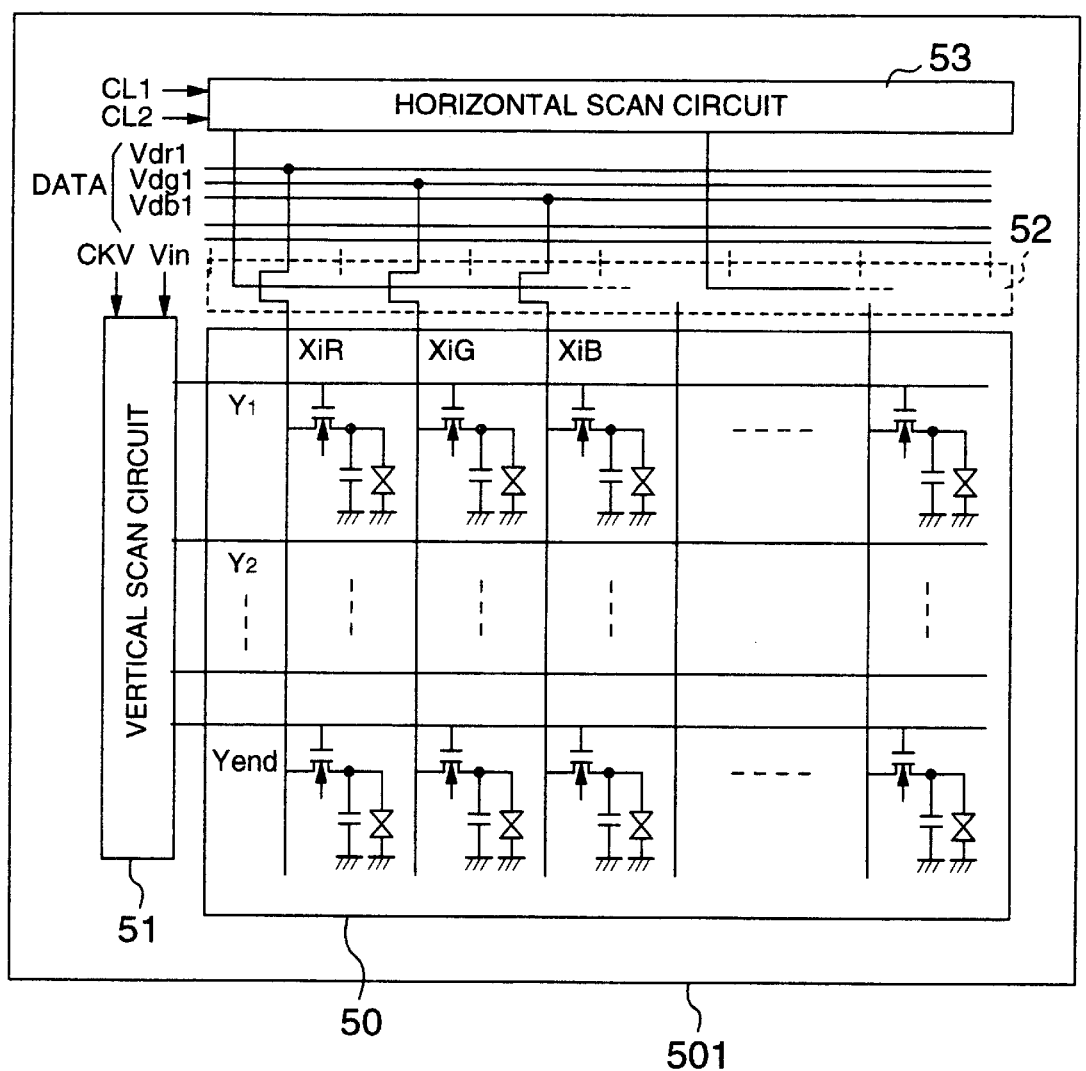
FIG. 5 is an equivalent circuit diagram of an active matrix type liquid crystal display device integrating a display area and a drive circuit using CMOS inverters integrated on the same substrate, according to an embodiment of the invention.

FIG. 5 is an equivalent circuit of an active matrix type liquid crystal display device having driver circuits made of CMOS inverters integrated together with an active matrix type liquid crystal display area on the same substrate 501.

This liquid crystal display device includes: an active matrix 50 made of TFT's formed in the display area; a vertical scan circuit 51 for driving the active matrix, a horizontal scan circuit 53 for time divisionally supplying video signals of one scan line to a plurality of divided blocks; data signal lines Vdrl, Vdg1, Vdb1, . . . for supplying video signals; and a switch matrix circuit 52 for supplying the video signals to the active matrix in unit of each divided block. The vertical and horizontal scan circuits 51 and 53 each are constituted of shift registers and buffers, and are driven by clock signals CL1, CL2, and CLV.

Figure 6:
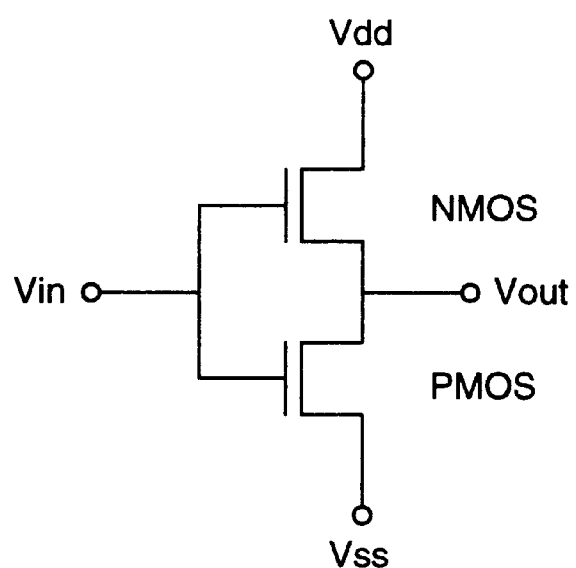
FIG. 6 is a circuit diagram of a CMOS inverter circuit of the liquid crystal display shown in FIG. 5.

FIG. 6 is a circuit diagram of a CMOS inverter circuit formed on the substrate. A PMOS and an NMOS are connected as shown in FIG. 6. The CMOS inverter circuit has an input terminal Vin and an output terminal Vout and is applied with a reference voltage Vss and a power source voltage Vdd.

Figure 7:
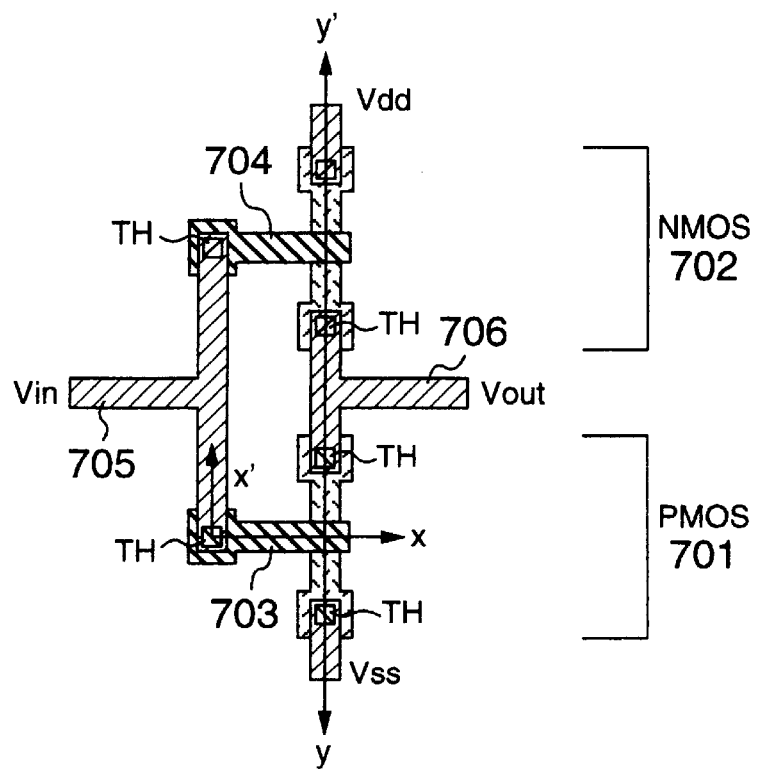
FIG. 7 is a pattern layout of the inverter circuit shown in FIG. 6.
Figure 8:
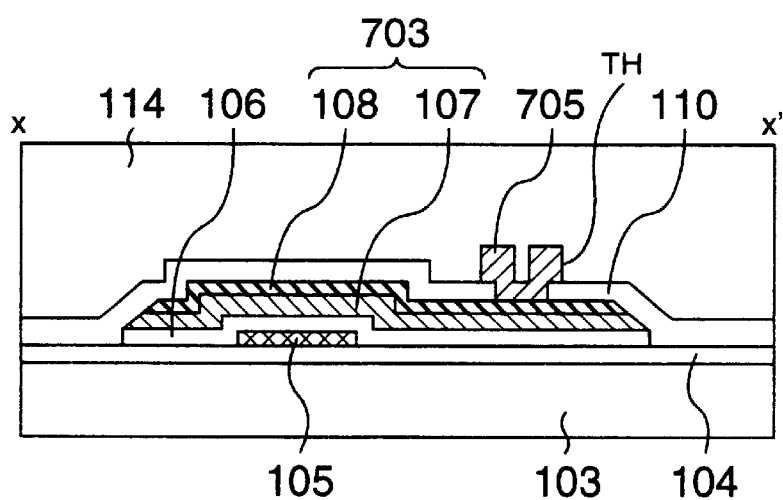
FIG. 8 is a cross sectional view of the inverter circuit taken along line x–x' shown in FIG. 7.
Figure 9:
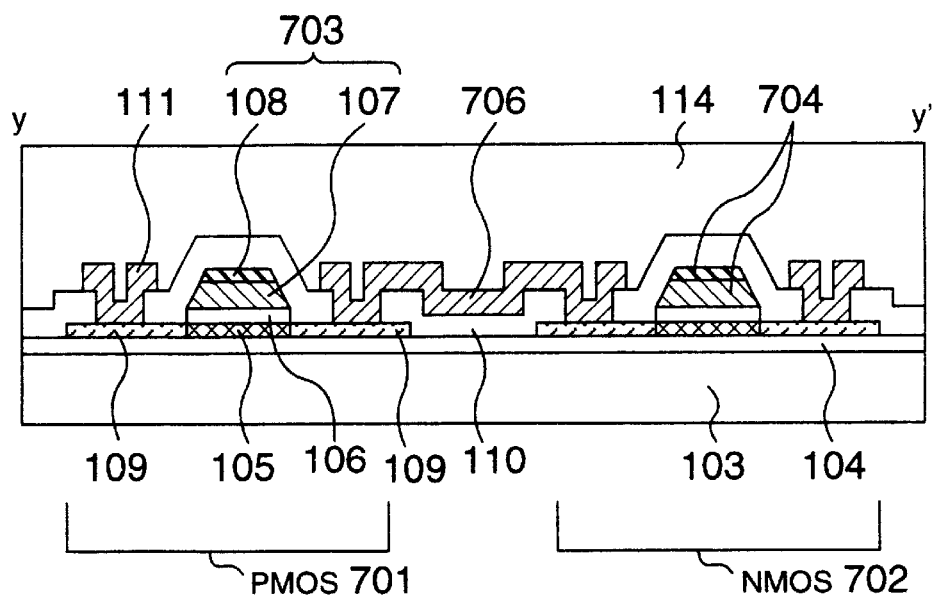
FIG. 9 is a cross sectional view of the inverter circuit taken along line y–y' shown in FIG. 7.

FIG. 7 shows a pattern layout of the inverter circuit shown in FIG. 6. FIG. 8 is a cross sectional view taken along line x–x' shown in FIG. 7, and FIG. 9 is a cross sectional view taken along line y–y' shown in FIG. 7. The CMOS inverter circuit of this embodiment is constituted of a PMOS 701 of a p-type TFT and an NMOS 702 of an n-type TFT.

As shown in FIG. 8, the gate electrodes 703 and 704 of two TFT's 701 and 702 are connected via through holes TH to a first electrode wiring 705 integrally formed with the input terminal Vin.

As shown in FIG. 9, the electrodes for supplying the circuit with the reference voltage Vss and power source voltage Vdd and the output terminal Vout connected to the drain electrodes of the two TFT's are made of a second electrode wiring 706. An output from the output terminal Vout is supplied to a shift register corresponding to the next stage scan line.

Both the wiring electrodes 705 and 706 are made of the same layer and same material as those of the drain electrode wiring of TFT. On the input terminal Vin side, it is necessary to ensure good through hole contact characteristics between the electrode wiring 705 and the TFT gate electrodes 703 and 704, i.e., between the drain electrode wiring and gate electrode wiring. The lamination gate electrode wiring structure is used for TFT constituted of the p-type transistor PMOS 701 and an n-type transistor NMOS 702. Specifically, the gate electrodes 703 and 704 each are constituted of the first layer 107 of Nb or alloy containing Nb as its main component and the second layer 108 of nitride of the first layer, whereas the electrode wirings 705 and 706 each are made of the drain electrode wiring material of Cr or CrMo alloy. The interlayer insulating film 110 on the gate electrodes 703 and 704 is made of an $SiO_2$ film.

The gate electrodes 703 and 704 has the Nb series/NbN series lamination film structure so that a sufficient resistance to thermal oxidation is ensured. Therefore, the resistance of the gate electrode wiring does not increase after the interlayer insulating film of $SiO_2$ is formed.

The through hole contact resistance between a lamination film of Nb and Nb nitride and the Cr or CrMo alloy film is sufficiently low as shown in FIG. 27. Therefore, good through contact characteristics are ensured for interconnection of the electrode wiring 705 and the TFT gate electrodes 703 and 704.

As described earlier with reference to FIG. 25, since selective etching of the interlayer insulating film 110 on the gate electrodes 703 and 704 is possible, the underlying gate electrode 703 and 704 are not damaged during the process of forming through holes. A CMOS inverter having good characteristics and a simple structure can be formed so that the peripheral circuit can be easily mounted in the liquid crystal display device and considerably high performance and low cost of the device can be realized. In the embodiment described above, a film formed of Cr or alloy of Cr and Mo is used for a material of the drain electrode or the drain electrode wiring. Further, if drain electrode wiring structure that the portion contacting with the gate electrode and the gate electrode wiring is constituted by the first layer formed of the film formed of Cr or alloy of Cr and Mo, and the second layer formed of low resistance metal film of aluminum alloy is formed on the first layer is adopted, not only the through-hole contact characteristic is improved but also low resistances of the drain electrode and the drain electrode wiring can be realized.

In the above embodiment, the liquid crystal display device is formed by using coplanar type TFT's. TFT may be of an inverse stagger type or of a normal stagger type. In the embodiment described above, the entire system is constituted by twisted nematic type TFT/LCDs. On the other hand, the entire system may be constituted by in plane switching type TFT/LCDs applying electric field between the source and the common electrode formed on the same glass substrate in the transverse direction. The above embodiment is also applicable to the TFT channel layer made of amorphous silicon instead of intrinsic polysilicon. In the embodiment to follow, the invention is applied to amorphous silicon TFT's of the inverse stagger type.

Figure 10:
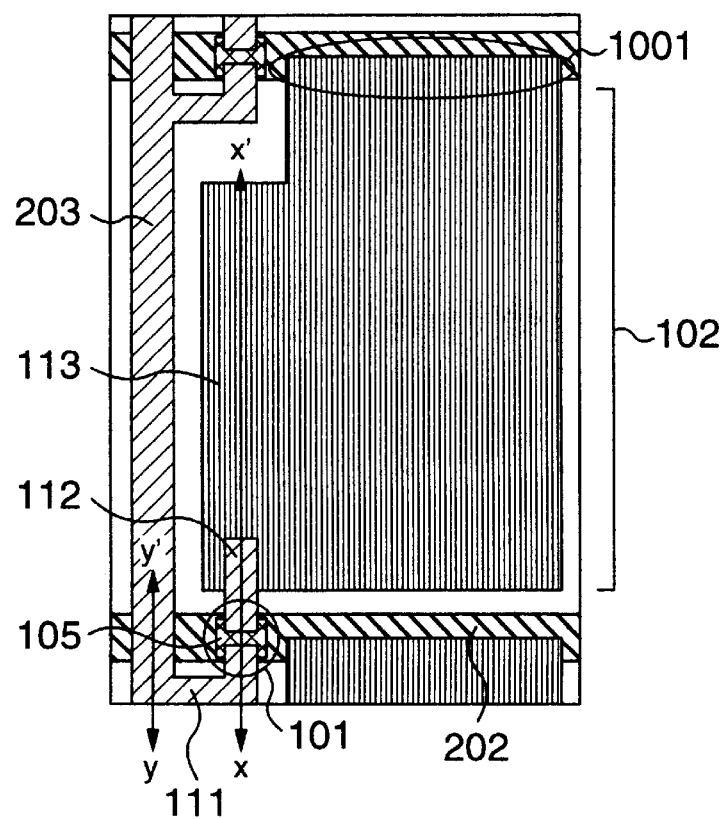
FIG. 10 is a plan view of a single pixel of an active matrix type liquid crystal display device using inverse stagger type TFT's according to an embodiment of the invention.

FIG. 10 is a plan view of a single pixel of an active matrix type liquid crystal display device using inverse stagger type TFT's according to an embodiment of the invention.

Figure 11:
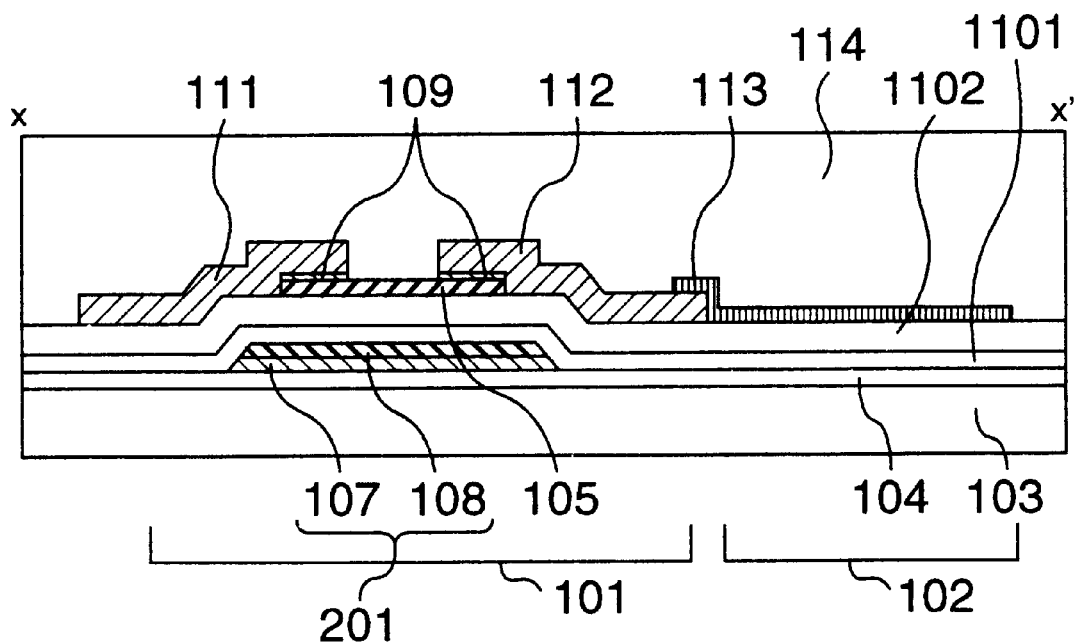
FIG. 11 is a cross sectional view taken along line x–x' shown in FIG. 10.
Figure 12:
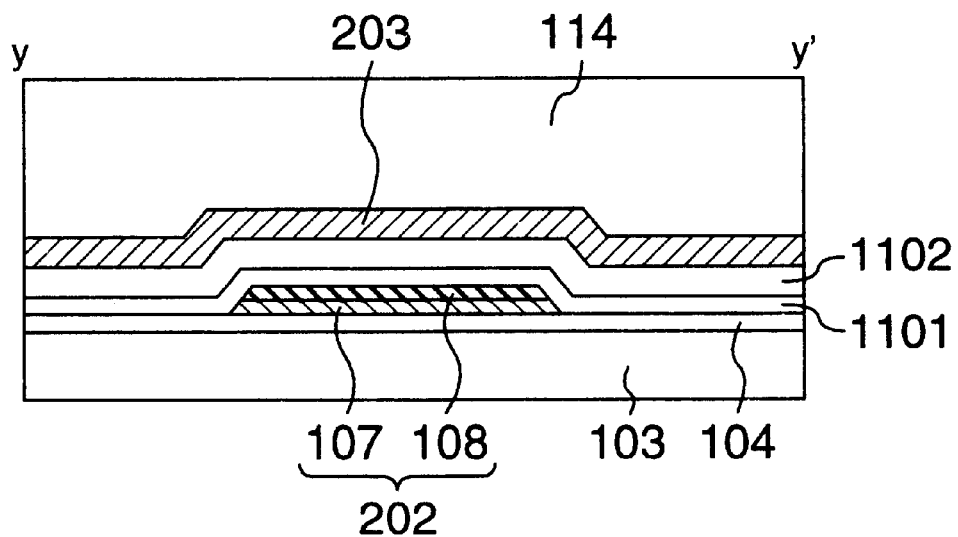
FIG. 12 is a cross sectional view taken along line y–y' shown i FIG. 10.

FIGS. 11 and 12 are cross sectional views taken along lines x–x' and y–y' shown in FIG. 10.

The fundamental structure of a single pixel of the liquid crystal display device of this embodiment is constituted of the gate electrode wiring 202 formed on the underlying film 104 on the glass substrate 103, the drain electrode wiring 203 crossing the gate electrode wiring 202, TFT 101 formed near each cross point between the gate and drain electrode wirings, the pixel display area 102, and the added capacitor 1001.

Different points from the coplanar type TFT described with reference to FIG. 1 to FIG. 4E reside in that TFT 101 is of the inverse stagger type, that the channel region 105 and drain and source active regions 109 doped with impurities are made of amorphous silicon, and that the gate insulating film is made of a lamination film of a first gate insulating film 1101 of $SiO_2$ and a second gate insulating film of SiN.

In order to ensure the stability of an interface between the amorphous silicon channel region and the gate insulating film of an amorphous silicon TFT, an SiN film is commonly used as the gate insulting film.

However, if the gate insulating film is made of an SiN single layer, it is difficult, as described earlier, to selectively etch the SiN gate insulating film formed on the lamination type gate electrode and the gate electrode wirings 201 and 202, the lamination type gate electrode of a lamination film (Nb series/NbN series) being constituted of the first layer 107 of Nb or alloy containing Nb as its main component and the second layer 108 of nitride of the first layer.

From the above reason, this embodiment adopts the lamination gate insulating film structure of the first gate insulating film 1101 of $SiO_2$ and the second gate insulating film of SiN. The selective etching characteristics relative to the gate electrode and gate electrode wirings 201 and 202 are ensured by the first gate insulating film 1101 of $SiO_2$, and the stability of the interface to the channel region 105 is ensured by the second gate insulating film 1102 of SiN.

Since the gate electrode and gate electrode wirings 201 and 202 have the Nb series/NbN series lamination film structure, they have sufficient resistance to thermal oxidation. Therefore, the resistance of the gate electrode wiring does not increased after the first gate insulating film 1101 of $SiO_2$ is formed.

FIG. 12 shows a cross area between the gate electrode wiring 202 and drain electrode wiring 203. According to the invention, the peripheral wall of the etched gate electrode wiring 202 pattern made of the lamination film of the first layer 107 of Nb or alloy containing Nb as its main component and the second layer 108 of nitride of the first layer is etched to have a normal taper shape. Such a taper shape of the etched gate electrode wiring 202 ensures a good peripheral portion around the first gate insulating film 1101 of $SiO_2$ and the second gate insulating film 1102 of SiN and around the drain electrode wiring 203 respective formed on the gate electrode 201, so that a short circuit between wirings and a breakage of the drain electrode wiring 203 can be prevented. Since there is no hillock or whisker like Al electrode wiring, it is obvious that a defective product having a short circuit between wirings can be reduced.

Figure 13:
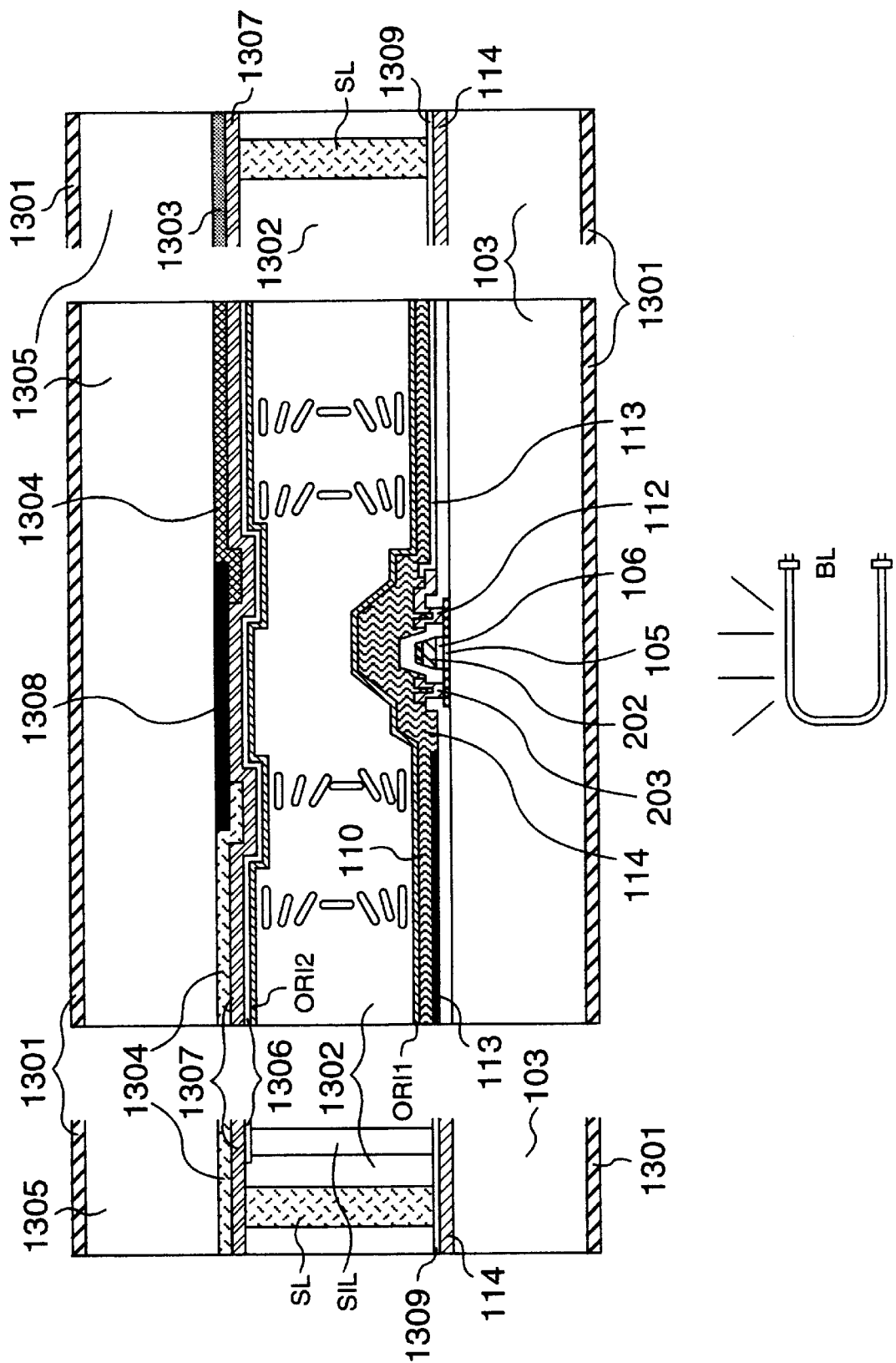
FIG. 13 is a schematic cross sectional view of an active matrix type liquid crystal display device according to an embodiment of the invention.

FIG. 13 is a schematic cross sectional view of an active matrix type liquid crystal display device according to the invention. On a glass substrate 103 under a liquid crystal layer 1302, gate electrode wirings (scan signal wirings) 202 and drain electrode wirings (video signal wirings) 203 are disposed in a matrix shape, and TFT formed near each cross point between the gate and drain electrode wirings drives a pixel electrode 113 made of ITO. Formed on an opposing glass substrate 1305 facing the glass substrate 130 via the liquid crystal layer 1302 are an opposing electrode 1306 made of ITO, a color filter film 1304, a color filter protective film layer 1307, and a light shielding film 1308 which forms a light shielding black matrix pattern.

A central area of FIG. 13 shows a cross section of one pixel, the left side shows the left side portion of a pair of glass substrates 103 and 1305 where external lead terminals are formed, and the right side shows the right side portion of the pair of glass substrates 103 and 1305 where external lead terminals are not formed.

The sealing members SL shown in the right and left portions of FIG. 13 seal the liquid crystal layer 1302 and are formed along the whole periphery of the glass substrates 103 and 1305 excepting a liquid crystal injection port (not shown). For example, the sealing member is made of epoxy resin. The opposing electrode 1306 on the opposing glass substrate 1305 is connected at least one point to the external lead wiring formed on the glass substrate 103 via the silver paste member SIL. This external lead wiring is formed by the same manufacture processes as the gate electrode wiring 202, source and drain electrode wirings 112 and 203. So, concretely, extraction wirings from the gate electrode wirings 201 may be constituted by the Nb series/NbN series stacked film structure, for example. The respective extraction wirings may be connected to the external driving circuit of TCP (Tape Carrier Package) or COG (Chip on Glass) connection type through ACF (Anisotropic Conducting Film). The orientation films ORI 1 and ORI 2, pixel electrodes 113, protective film 114, interlayer insulating film 110, and gate insulating film 106 of $SiO_2$ are formed in an area inside of the sealing member SL. Polarizing plates 1301 is mounted on the outer surfaces of the pair of glass substrates 103 and 1305.

The liquid crystal layer 1302 is sealed between the lower and upper orientation films ORI 1 and ORI 2 which determine the orientation of liquid crystal molecules, and is sealed with the sealing member SL. The lower orientation film ORI 1 is formed on the protective insulating film 114 of the glass substrate 103. Sequentially laminated on the inner surface of the opposing glass substrate 1305 are the light shielding film 1308, color filter film 1304, color filter protective film 1307, opposing electrode 1306, and upper orientation film ORI 2. This liquid crystal display device is manufactured by independently forming the layers of the glass substrate 103 and opposing glass substrate and thereafter by stacking the upper and lower substrates 103 and 1305 upon each other to inject liquid crystals 1302 therebetween. By adjusting light transmission from the back light BL by using the pixel electrode 113, a TFT drive type color liquid crystal display device can be realized.

As above, since the gate electrode (scan signal wiring) 201 and gate electrode wiring 202 have the lamination gate electrode wiring structure of Nb or alloy containing Nb as its main component and nitride thereof, a simple gate electrode wiring structure can be realized which is excellent in resistance to thermal oxidation, good patterning characteristics, in process workability and integrity and has a low resistance and a low stress. Accordingly, an active matrix type liquid crystal display device excellent in throughput and manufacture yield can be easily realized.

Since the peripheral circuit can be easily fabricated in the liquid crystal display device, a liquid crystal display device of considerably high performance and low cost can be realized. In the embodiment described above, the entire system is constituted by twisted nematic type TFT/LCDs. On the other hand, the entire system may be constituted by in plane switching type TFT/LCDs having the common electrode and the common electrode wiring.

TFT may be either a coplanar type, inverse stagger type, or normal stagger type. If the coplanar type element is used, the parasitic capacitance between the gate and source or drain becomes small. Therefore, a faster operation is possible which is effective for a liquid crystal display device of the type that the peripheral circuit is built therein.

The invention is also applicable to a liquid crystal display device with the peripheral circuit not built in and having TFT with amorphous silicon channel region in place of intrinsic polysilicon channel region.

In the above embodiments, the lamination structure of Nb/NbN or NbN/Nb/NbN is applied to the gate electrode and gate electrode wiring. This lamination structure is also applicable to the drain electrode wiring, source electrode, common electrode if provided, and common electrode wiring if provided with similar advantageous effects of resistance to thermal oxidation good integrity with an insulating film, and good through-hole contact characteristic through an insulating film.

The alloy containing Nb as its main component and the nitride of alloy containing Nb as its main component may be Nb alloy containing several % or less of W, Mo, Ti, V, Si, or the like, or nitride thereof.

According to the embodiments of the invention, a liquid crystal display device can be realized which has high performance and low cost and is easy to form a wiring excellent in resistance to thermal oxidation.

What is claimed is:

1. A liquid crystal display device having a pair of substrates with a liquid crystal layer being interposed therebetween, the liquid crystal display device comprising:
  a wiring formed on one of the pair of substrates, the wiring including a first layer made of Nb or alloy containing Nb as a main component thereof and a second layer made of nitride of Nb or nitride of alloy containing Nb as a main component; and
  a third layer formed under the first layer and made of nitride of Nb or nitride of alloy containing Nb as a main component.

2. A liquid crystal display device according to claim 1 or 3, further comprising an insulating film formed on said wiring layer and made of silicon oxide.

3. A liquid crystal display device having a pair of substrates with a liquid crystal layer being interposed therebetween, the liquid crystal display device comprising:
  a wiring formed on one of the pair of substrates, the wiring including a first layer made of Nb or alloy containing Nb as a main component thereof and a second layer made of nitride of Nb or nitride of alloy containing Nb as a main component, wherein the first and second layers are etched in succession into a same pattern;
  wherein a specific resistance of the first layer is 20 $\mu\Omega$cm or smaller, and a specific resistance of the second layer is in a range from 100 $\mu\Omega$cm to 200 $\mu\Omega$cm.

4. A liquid crystal display device according to claim 1, wherein the first, second, and third layers are etched in succession into a same pattern.

5. A liquid crystal display device according to claim 3, wherein a peripheral wall of said wiring pattern has a normal taper shape.

6. A liquid crystal display device according to claim 1, wherein a specific resistance of the first layer is 20 $\mu\Omega$cm or smaller, and a specific resistance of the second layer is in a range from 100 $\mu\Omega$cm to 200 $\mu\Omega$cm.

7. A liquid crystal display device having a pair of substrates with a liquid crystal layer being interposed therebetween, the liquid crystal display device comprising:

a wiring formed on one of the pair of substrates, said wiring including a layer made of nitride of Nb or nitride of alloy containing Nb as a main component;

wherein said layer made of nitride of Nb or nitride of alloy containing Nb as a main component has a specific resistance in a range from 100 $\mu\Omega$cm to 200 $\mu\Omega$cm.

8. A liquid crystal display device according to claim 1 or 3, wherein a thickness of the second layer is in a range from 5 nm to 100 nm.

9. A liquid crystal display device having a pair of substrates with a liquid crystal layer being interposed therebetween, a plurality of drain electrode wirings crossing the plurality of gate electrode wirings, a plurality of thin film transistors formed at cross points between the plurality of gate and drain electrode wirings, and a plurality of source electrodes formed in correspondence with the plurality of thin film transistors, respectively being formed on one of the pair of substrates, wherein:

at least ones of the plurality of gate electrode wirings, drain electrode wirings, source electrodes, common electrodes if provided, and common electrode wirings if provided are each made of a lamination film including a first layer made of Nb or alloy containing Nb as a main component thereof and a second layer made of nitride of Nb or nitride of alloy containing Nb as a main component;

wherein the first and second layers are etched in succession into a same pattern; and wherein a specific resistance of the first layer is 20 $\mu\Omega$cm or smaller, and a specific resistance of the second layer is in a range from 100 $\mu\Omega$cm to 200 $\mu\Omega$cm.

10. A liquid crystal display device having a pair of substrates with a liquid crystal layer being interposed therebetween, a plurality of drain electrode wirings crossing the plurality of gate electrode wirings, a plurality of thin film transistors formed at cross points between the plurality of gate and drain electrode wirings, and a plurality of source electrodes formed in correspondence with the plurality of thin film transistors, respectively being formed on one of the pair of substrates, wherein:

at least ones of the plurality of gate electrode wirings, drain electrode wirings, and source electrodes, and common electrodes if provided and common electrode wirings if provided are each made of a layer made of nitride of Nb or nitride of alloy containing Nb as a main component.

11. A liquid crystal display device having a pair of substrates with a liquid crystal layer being interposed therebetween, a plurality of drain electrode wirings crossing the plurality of gate electrode wirings, a plurality of thin film transistors formed at cross points between the plurality of gate and drain electrode wirings, and a plurality of source electrodes formed in correspondence with the plurality of thin film transistors, respectively being formed on one of the pair of substrates, wherein:

at least ones of the plurality of gate electrode wirings, drain electrode wirings, source electrodes, common electrodes if provided, and common electrode wirings if provided are each made of a lamination film including a first layer made of Nb or alloy containing Nb as a main component thereof and a second layer made of nitride of Nb or nitride of alloy containing Nb as a main component; and a third layer formed under the first layer and made of nitride of Nb or nitride of alloy containing Nb as a main component.

12. A liquid crystal display device according to claim 9, further comprising an insulating film formed on said lamination layer of the first and second layers and made of silicon oxide.

13. A liquid crystal display device according to claim 12, wherein said silicon oxide film forms at least a portion of a gate insulating film of the thin film transistor.

14. A liquid crystal display device according to claim 9, 10 or 11, wherein the drain electrode wiring or a source wiring electrode is made of a chromium film or an alloy film of chromium and molybdenum.

15. A liquid crystal display device according to claim 9, 10 or 11, wherein at least a portion of the drain electrode wiring or a source wiring electrode is made of a chromium film or an alloy film of chromium and molybdenum.

16. A liquid crystal display device according to claim 10, further comprising an insulating film formed on said lamination layer of the first and second layers and made of silicon oxide.

17. A liquid crystal display device according to claim 1 or 3, wherein the wiring is at least one of a gate electrode wiring and a drain electrode.

* * * * *